United States Patent
Lih et al.

(10) Patent No.: US 7,952,910 B2
(45) Date of Patent: May 31, 2011

(54) MEMORY DEVICE WITH SPLIT POWER SWITCH

(75) Inventors: Yolin Lih, San Jose, CA (US); Dennis Wendell, Sunnyvale, CA (US); Jun Liu, Cupertino, CA (US); Daniel Fung, Fremont, CA (US); Ajay Bhatia, Santa Clara, CA (US); Shyam Balasubramanian, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 315 days.

(21) Appl. No.: 11/932,555

(22) Filed: Oct. 31, 2007

(65) Prior Publication Data

US 2008/0273412 A1    Nov. 6, 2008

Related U.S. Application Data

(60) Provisional application No. 60/888,006, filed on Feb. 2, 2007.

(51) Int. Cl.
    *G11C 11/00* (2006.01)
(52) U.S. Cl. ......................... 365/154; 365/226; 365/227
(58) Field of Classification Search .................. 365/154, 365/226, 227
See application file for complete search history.

(56) References Cited

U.S. PATENT DOCUMENTS

| | | | |
|---|---|---|---|
| 4,686,391 A | 8/1987 | Gudaitis | |
| 5,870,331 A | 2/1999 | Hwang et al. | |
| 6,147,898 A * | 11/2000 | Yamada | 365/156 |
| 6,635,936 B1 | 10/2003 | Wuu et al. | |
| 6,771,095 B1 | 8/2004 | Dunlea et al. | |
| 6,781,870 B1 | 8/2004 | Kushida | |
| 6,903,962 B2 * | 6/2005 | Nii | 365/156 |
| 7,092,280 B2 | 8/2006 | Joshi | |
| 7,447,058 B2 * | 11/2008 | Maki et al. | 365/154 |
| 7,502,275 B2 | 3/2009 | Nii et al. | |
| 2004/0217448 A1 | 11/2004 | Kumagai et al. | |
| 2006/0268626 A1 | 11/2006 | Hamzaoglu et al. | |

(Continued)

FOREIGN PATENT DOCUMENTS

WO    2007018780    2/2007

OTHER PUBLICATIONS

PCT International Preliminary Report on Patentability dated Aug. 13, 2009, 7 pages.

(Continued)

*Primary Examiner* — Vu A Le
*Assistant Examiner* — Han Yang
(74) *Attorney, Agent, or Firm* — Osha • Liang LLP

(57) ABSTRACT

A memory device having a split power switch is provided to improve the writeability of static random access memory (SRAM) cells without adversely compromising their stability. For example, various split power switch circuits are used to permit the voltage or current of a power supply line connected with one side of an SRAM cell to drop during write operations. This drop weakens one side of the SRAM cell and reduces the drive-fight between transistors of the SRAM cell and external write circuitry. As a result, the minimum voltage for writing new logic states into the SRAM cell is reduced to permit overall lower operating voltages for the SRAM cell and related circuitry. By continuing to maintain a second side of the SRAM cell at the reference voltage or current, the SRAM cell can successfully switch to a newly written logic state.

11 Claims, 11 Drawing Sheets

U.S. PATENT DOCUMENTS

| | | |
|---|---|---|
| 2007/0013428 A1 | 1/2007 | Vadi et al. |
| 2007/0030741 A1 | 2/2007 | Nii et al. |
| 2008/0094878 A1* | 4/2008 | Joshi et al. .................... 365/154 |

OTHER PUBLICATIONS

V. Degalahal et al, "Soft Errors Issues in Low-Power Caches," IEEE Transactions on VLSI Systems, vol. 13, No. 10, Oct. 2005, pp. 1157-1166.

V. Degalahal et al, "Analyzing Soft Errors in Leakage Optimized SRAM Design," Proceedings of the 16th International Conference on VLSI Design, Jan. 4-8, 2003, pp. 1-7.

Y. Lih et al, "A Leakage Current Replica Keeper for Dynamic Circuits," IEEE Journal of Solid-State Circuits, vol. 42, No. 1, Jan. 2007, pp. 48-55.

M. Yamaoka et al, "90-nm Process-Variation Adaptive Embedded SRAM Modules with Power-Line-Floating Write Technique," IEEE Journal of Solid-State Circuits, vol. 41, No. 3, Mar. 2006, pp. 705-711.

K. Zhang et al, "A 3-GHz 70-Mb SRAM in 65-nm CMOS Technology with Integrated Column-Based Dynamic Power Supply," IEEE Journal of Solid-State Circuits, vol. 41, No. 1, Jan. 2006, pp. 146-151.

N. Mokhoff, "Digital Designer's Plight Debated at ISSCC," http://www.eetimes.com/showArticle.jhtml? articleID=179101341, Feb. 7, 2006, pp. 1-2.

E. Seevinck et al, "Static-Noise Margin Analysis of MOS SRAM Cells," IEEE Journal of Solid-State Circuits, vol. SC-22, No. 5, Oct. 1987, pp. 748-754.

B. Calhoun and A. Chandrakasan, "Analyzing Static Noise Margin for Sub-threshold SRAM in 65nm CMOS," Proceedings of ESSCIRC, Sep. 2005, pp. 363-366.

International Search Report for International Application No. PCT/US2006024680, dated Jan. 12, 2006, pp. 1-3.

M. Horstmann et al, "Advanced Transistor Structures for High Performance Microprocessors," International Conference on Integrated Circuit Design and Technology, May 17-20, 2004, pp. 65-61.

H. S. Yang et al, "Dual Stress Liner for High Performance sub-45nm Gate Length SOI CMOS Manufacturing," IEDM Technical Digest, Dec. 13-15, 2004, pp. 1075-1077.

European Search Report for European Application No. 08728581.3-1233 dated Mar. 4, 2010, 7 pages.

U.S. Office Action for U.S. Appl. No. 11/932,643 dated Dec. 7, 2009, 8 pages.

U.S. Office Action for U.S. Appl. No. 11/932,643 dated May 6, 2010, 7 pages.

U.S. Office Action for U.S. Appl. No. 11/932,643 dated Aug. 16, 2010, 6 pages.

U.S. Office Action for U.S. Appl. No. 11/932,643 dated Dec. 16, 2010, 9 pages.

* cited by examiner

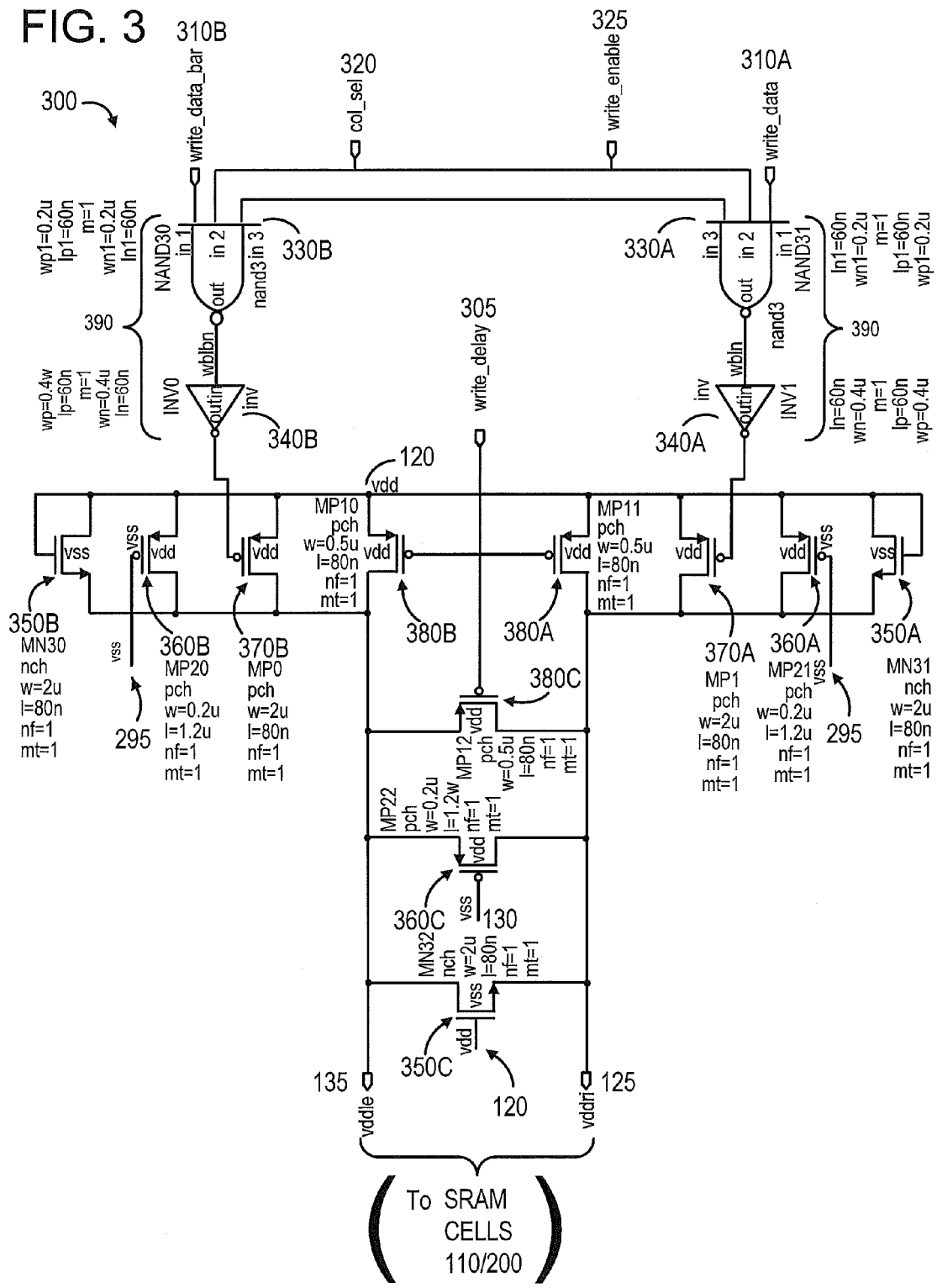

MEMORY DEVICE WITH SPLIT POWER SWITCH

CROSS-REFERENCE TO RELATED APPLICATIONS

This application claims the benefit of U.S. Provisional Patent Application No. 60/888,006 filed on Feb. 2, 2007 and entitled "Split Power Switch for Memory Cells", which is incorporated herein by reference.

BACKGROUND

As is well known, static random access memory (SRAM) cells can be implemented using cross-coupled logic gates to maintain logic states corresponding to various associated data values. In this regard, it is generally desirable for SRAM cells to hold their stored logic states despite possible changes in voltage, temperature, or other operating conditions. It is also desirable for SRAM cells to permit changes in their logic states in response to write operations. Unfortunately, existing SRAM cell designs often fail to provide high degrees of both stability and writeability.

For example, in one approach to improve stability and writeability, the minimum and maximum operating voltage of an SRAM cell may be limited. However, such implementations can become impractical due to possible changes in voltage caused by environmental or other operating conditions.

In an approach to improve stability, an SRAM cell may be implemented with robust cross-coupled logic gates that are resilient to outside disturbances. However, if the SRAM cell is too robust, it can become difficult for the SRAM cell to switch to a newly written logic state. For example, if the SRAM cell's PMOS transistors are too strong, they may prevent one of the SRAM cell's internal nodes from being pulled down to an appropriate voltage corresponding to a newly written logic state. This can negatively affect the writeability of the SRAM cell.

In an approach to improve writeability, the cross-coupled logic gates of an SRAM cell may be weakened. Nevertheless, the logic states stored by the weakened SRAM cell may inadvertently change in response to variations in operating conditions, thereby compromising stability. Such a weakened SRAM cell can also impair writeability if the SRAM cell is unable to regenerate newly written logic states between its cross-coupled logic gates. For example, if the SRAM cell's PMOS transistors are too weak, they may be unable to pull up one of the SRAM cell's internal nodes to an appropriate voltage in response to a newly written logic state.

In another approach to improve writeability, a single power switch may be connected with a column of SRAM cells to reduce the voltage provided to all cross-coupled portions of the SRAM cells during write operations in response to write enable and column select signals. Although this approach may permit the voltage of one node of an SRAM cell to be easily pulled down, the reduced voltage on both cross-coupled logic gates can inhibit the SRAM cell's ability to adequately pull up the voltage of a second node of the SRAM cell in order to regenerate the newly written logic state between its cross-coupled logic gates.

Other efforts to improve writeability, such as increasing the size or strength of external circuit elements connected to word lines, lowering threshold voltages of transistors of the SRAM cell, increasing the word line voltage, or weakening the access transistors connected to the word lines can also negatively impact stability. Moreover, as SRAM operating voltages are reduced, variations in operating conditions and SRAM components can more easily impact the operation of SRAM cells which can have a correspondingly greater effect on stability and writeability.

SUMMARY

Various implementations of a split power switch and methods of operation are provided that may be used to improve the writeability characteristics of memory cells such as SRAM cells without adversely compromising their stability. In one implementation, a memory device includes a first power supply line, a second power supply line, a first static random access memory (SRAM) cell, and a split power switch circuit. The SRAM cell includes first and second cross-coupled logic gates. The first power supply line is connected with the first cross-coupled logic gate and the second power supply line is connected with one of the first and second cross-coupled logic gates. The split power switch circuit includes a first switch adapted to selectively provide a first power level to the first power supply line to maintain a first logic state in the SRAM cell. The first switch is also adapted to selectively provide a second power level to the first power supply line to write the first logic state in the SRAM cell.

Additional implementations of various split power switch circuits, SRAM cells, and other embodiments are further set forth herein. These and other features and advantages of the invention will be more readily apparent from the detailed description of the embodiments set forth below taken in conjunction with the accompanying drawings.

BRIEF DESCRIPTION OF THE FIGURES

FIGS. 3-6 illustrate circuits to implement various split power switches in accordance with embodiments of the invention.

DETAILED DESCRIPTION

In accordance with various embodiments further described herein, a split power switch is provided to improve the writeability characteristics of memory cells such as SRAM cells without adversely compromising their stability. In particular, various split power switch circuits described herein permit the voltage or current of a power supply line connected with one side of an SRAM cell to drop during write operations. This drop weakens one side of the SRAM cell and reduces the drive-fight between transistors of the SRAM cell and external write circuitry. As a result, the minimum voltage for writing new logic states into the SRAM cell is reduced to permit overall lower operating voltages for the SRAM cell and related circuitry. By continuing to maintain a second side of the SRAM cell at the reference voltage or current, the SRAM cell can successfully switch to a newly written logic state.

Figure 1:
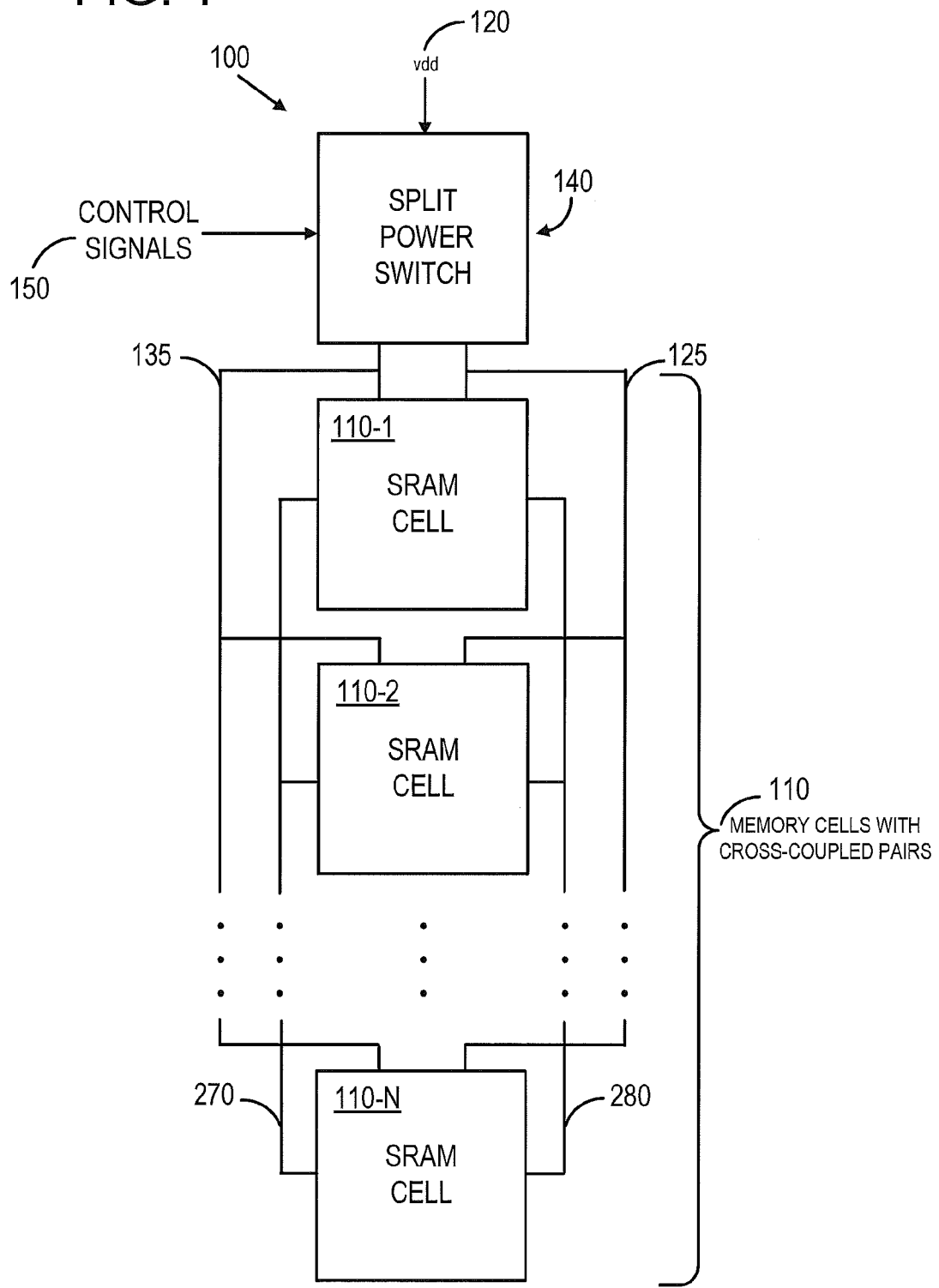
FIG. 1 illustrates a conceptual block diagram of a plurality of SRAM cells connected with a split power switch in accordance with an embodiment of the invention.

Referring now to the drawings wherein the showings are for purposes of illustrating embodiments of the invention only, and not for purposes of limiting the same, FIG. 1 illustrates a conceptual block diagram of a plurality of SRAM cells 110 (conceptually illustrated in FIG. 1 in block form) connected with a split power switch 140 (also conceptually illustrated in FIG. 1 in block form) as part of a memory device 100 in accordance with an embodiment of the invention. Several possible circuit implementations of split power switch 140 are illustrated in FIGS. 3-6 and FIG. 10 in accordance with various embodiments of the invention as will be further described herein.

As shown in FIG. 1, SRAM cells 110 are connected with power supply lines 125 and 135. In one embodiment, each of SRAM cells 110 may be implemented with a pair of cross-coupled logic gates, such as inverters. Although three SRAM cells 110 are illustrated in FIG. 1, any desired number of SRAM cells 110 may be implemented for use with various embodiments disclosed herein. For purposes of example, SRAM cells 110 are illustrated in FIG. 1 as a single column of memory cells connected to a single split power switch 140. However, other orientations may be used as may be desired in particular implementations. In this regard, additional groups of SRAM cells 110, power supply lines 125 and 135, and split power switches 140 may be used to provide a memory cell array arranged in a plurality of columns. For example, in one embodiment, each column of SRAM cells 110 may be implemented with associated power supply lines 125 and 135 and a single split power switch 140 as shown in FIG. 1. In another embodiment, multiple columns or subcolumns of SRAM cells 110 may be implemented to share associated power supply lines 125 and 135 and a single split power switch 140.

In yet another embodiment, multiple split power switches 140 may be used by a single column of SRAM cells 110. For example, a first set of SRAM cells 110 of the column may share a first split power switch 140 and a first set of power supply lines 125 and 135, and a second set of SRAM cells 110 of the column may share a second split power switch 140 and a second set of power supply lines 125 and 135. In this embodiment, all SRAM cells 110 of the column may optionally be implemented to share additional circuitry such as, for example, bit lines, data lines, and/or other read or write circuitry further described herein. The use of multiple split power switches 140 in this manner can permit quicker adjustment of power levels provided to each set of SRAM cells 110 through power supply lines 125 and 135.

In the embodiment shown in FIG. 1, each of power supply lines 125 and 135 is connected with one of the cross-coupled logic gates of each of SRAM cells 110. As also shown in FIG. 1, power supply lines 125 and 135 are connected with split power switch 140 which is also connected with a reference voltage 120 (labeled Vdd) which may be a positive voltage in this embodiment. In various embodiments, other power sources such as different reference voltages or reference currents may be used in place of reference voltage 120.

As also shown in FIG. 1, bit lines 270 and 280 are connected with each of SRAM cells 110-1 through 110-N. In this regard, SRAM cells 110-1 through 110-N may share bitlines 270 and 280. However, in other embodiments, bit lines may not be shared by all of SRAM cells 110-1 through 110-N. For example, in one embodiment, a first set of bit lines may be provided to SRAM cells 110-1 and 110-2, and a second set of bit lines may be provided to SRAM cell 110-N. In such an embodiment, SRAM cells 110-1 and 110-2 may use bit lines separate from those used by SRAM cell 110-N. In other embodiments, any desired combination of shared and/or unshared bit lines may be used.

In accordance with various embodiments further described herein, split power switch 140 selectively adjusts the voltages provided to power supply lines 125 and 135 (and therefore adjust the voltages provided by power supply lines 125 and 135 to all of SRAM cells 110) in response to one or more control signals 150. In particular, split power switch 140 may be configured to provide reference voltage 120 or a reference current to each of power supply lines 125 and 135 during read operations performed using SRAM cells 110. Split power switch 140 may be further implemented to permit the voltage or current provided to one of power supply lines 125 or 135 to fall during appropriate write operations performed on SRAM cells 110, while still maintaining a voltage or current approximately equal to reference voltage 120 or a reference current on the other one of power supply lines 125 or 135.

In one embodiment, memory device 100 is designed by initially selecting a device size for cross-coupled logic gates of SRAM cells 110 while power supply lines 125 and 135 are connected directly to a desired maximum value of reference voltage 120. Then, power supply lines 125 and 135 are connected to reference voltage 120 through split power switch 140. Split power switch 140 is then be sized to provide a desired reduced voltage to power supply lines 125 and 135.

Figure 2:
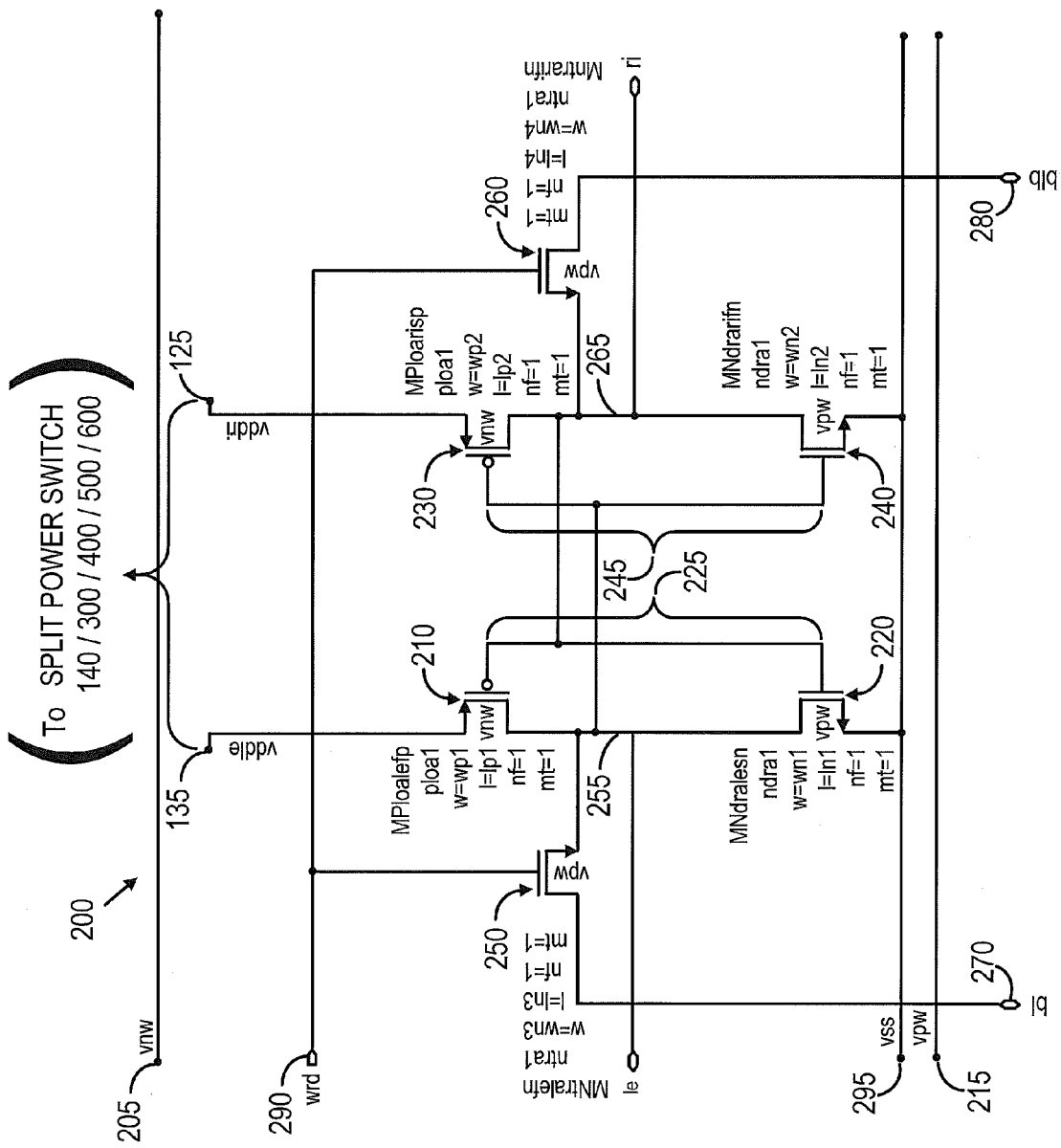
FIG. 2 illustrates a circuit to implement an SRAM cell in accordance with an embodiment of the invention

FIG. 2 illustrates a circuit 200 to implement an SRAM cell, such as any of SRAM cells 110 of FIG. 1, in accordance with an embodiment of the invention. In this regard, circuit 200 is connected with split power switch 140 through power supply lines 125 and 135.

As shown in FIG. 2, circuit 200 includes a pair of cross-coupled inverters 225 and 245 implemented by transistors 210/220 and 230/240, respectively. Transistor 210 is connected with power supply line 135. Similarly, transistor 230 is connected with power supply line 125. Each of transistors 220 and 240 are connected with a reference voltage 295 (labeled Vss) which may correspond, for example, to ground. FIG. 2 further illustrates that n-well and p-well voltages 205 and 215 (labeled vnw and vpw, respectively) of the transistors of circuit 200 need not be connected with reference voltage 120 (previously described in FIG. 1) or reference voltage 295.

Access transistors 250 and 260 are connected with word line 290 as well as bit lines 270 and 280, and nodes 255 and 265, respectively. Accordingly, word line 290 selectively connects bit lines 270 and 280 with nodes 255 and 265 through access transistors 250 and 260, respectively.

While circuit 200 is storing a given logic state, split power switch 140 maintains the voltage of each of power supply lines 125 and 135 approximately equal to reference voltage 120. For example, if circuit 200 is storing a first logic state (e.g., corresponding to a data value of 0), node 255 may be set to a logic low voltage while node 265 is set to a logic high voltage. Accordingly, transistors 220 and 230 will be turned on, and transistors 210 and 240 will be turned off. In this case, because the voltage of power supply line 125 is approximately equal to reference voltage 120, transistor 230 pulls up the voltage of node 265 to maintain the first logic state.

Similarly, if circuit 200 is storing a second logic state (e.g., corresponding to a data value of 1), node 265 may be set to a logic low voltage while node 255 is set to a logic high voltage. Accordingly, transistors 210 and 240 turn on, and transistors 220 and 230 turn off. In this second case, because the voltage of power supply line 135 is also approximately equal to reference voltage 120, transistor 210 pulls up the voltage of node 255 to maintain the second logic state.

Split power switch 140 continues to maintain the voltage of each of power supply lines 125 and 135 approximately equal to reference voltage 120 during read operations. For example, during a read operation, bit lines 270 and 280 may be precharged and word line 290 may be set to a logic high voltage to turn on access transistors 250 and 260. Accordingly, inverters 225 and 245 drive bit lines 270 and 280 with appropriate voltages corresponding to the logic state stored by circuit 200.

For a read operation in which circuit 200 is storing a first logic state, transistors 220 and 230 turn on, and transistors 210 and 240 turn off. Accordingly, transistor 220 pulls down the voltage of bit line 270, and transistor 230 pulls up the voltage of bit line 280. Because the voltage of power supply line 125 is approximately equal to reference voltage 120, transistor 230 operates with sufficient current to pull up the voltage of node 265 in order to drive bit line 280.

Similarly, for a read operation in which circuit 200 is storing a second logic state, transistors 210 and 240 turn on, and transistors 220 and 230 turn off. Accordingly, transistor 240 pulls down the voltage of bit line 280, and transistor 210 pulls up the voltage of bit line 270. Again, because the voltage of power supply line 135 is approximately equal to reference voltage 120, transistor 210 operates with sufficient current to pull up the voltage of node 255 in order to drive bit line 270.

However, during a write operation to switch circuit 200 from a first logic state to a second logic state, split power switch 140 permits the voltage of power supply line 125 to fall below reference voltage 120 while continuing to maintain the voltage of power supply line 135 approximately equal to reference voltage 120. In this example, nodes 255 and 265 are initially set to logic low and high voltages, respectively, transistors 220 and 230 turn on, and transistors 210 and 240 turn off while circuit 200 initial stores the first logic state. During the write operation to store the second logic state into circuit 200, bit lines 270 and 280 are driven high and low, respectively, by appropriate write circuitry (not shown), and word line 290 is driven high to turn on access transistors 250 and 260. Accordingly, bit line 280 pulls node 265 down from a logic high voltage to a logic low voltage. As described above, because transistor 230 is turned on, it will continue to attempt to pull up the voltage of node 265. However, by permitting the voltage of power supply line 125 to fall below reference voltage 120 during the write operation, transistor 230 operates with less current, thereby improving the ability of bit line 280 to overcome transistor 230 and pull down node 265.

When node 265 is pulled below the threshold voltage of transistor 210, transistor 210 turns on and pulls up the voltage of node 255. By maintaining the voltage of power supply line 135 approximately equal to reference voltage 120 during the write operation, transistor 210 operates with sufficient current to pull up the voltage of node 255 in order to change circuit 200 to the second logic state.

During a second write operation to switch circuit 200 from the second logic state to the first logic state, split power switch 140 permits the voltage of power supply line 135 to fall below reference voltage 120 while continuing to maintain the voltage of power supply line 125 approximately equal to reference voltage 120. In this case, transistor 210 operates with less current, thereby improving the ability of bit line 270 to overcome transistor 210 and pull down node 255. By maintaining the voltage of power supply line 125 approximately equal to reference voltage 120 during the second write operation, transistor 230 operates with sufficient current to pull up the voltage of node 265 in order to change circuit 200 back to the first logic state.

Advantageously, by selectively reducing the power provided to power supply line 125 or 135 during write operations, the switch points of inverters 225 and 245 are not degraded. Transistor 210 or 230 of the side of the SRAM cell being written to continues to operate in a linear mode (e.g., operating similar to a resistor) during a write operation while power is reduced to its associated power supply line 125 or 135. However, because the power provided to other side of the SRAM cell is not reduced during the write operation, the switch point of the inverter on the other side is not degraded. As a result, sufficient write current is provided through access transistor 250 or 260 to cause a voltage drop through transistor 210 or 230 sufficient to lower the voltage of node 255 or 265 below the switch point of the inverter to properly regenerate a newly written logic state through circuit 200.

FIG. 3 illustrates a circuit 300 to implement split power switch 140 of FIG. 1 in accordance with an embodiment of the invention. As shown in FIG. 3, circuit 300 may be connected with one or more of SRAM cells 110 (which may be implemented, for example, by one or more circuits 200) through power supply lines 125 and 135.

Circuit 300 is implemented to receive a plurality of signals including a write recovery signal 305 (labeled write_delay), write data signals 310A-B (labeled write_data and write_data_bar), a column select signal 320 (labeled col_sel), and a write enable signal 325 (labeled write_enable). Signals 305, 310A-B, 320, and 325 may be used to selectively adjust the voltages provided to power supply lines 125 and 135 as further described herein.

Circuit 300 includes logic 390 which may be implemented, for example, with NAND gates 330A-B and inverters 340A-B. NAND gates 330A-B are connected with signals 310A-B, 320, and 325. Inverters 340A-B are connected with the outputs of NAND gates 330A-B as well as the gates of main switch transistors 370A-B. In this regard, the operation of main switch transistors 370A-B is determined by logic 390 in response to signals 310A-B, 320, and 325. Specifically, main switch transistors 370A-B turn on when inverters 340A-B provide logic low output values, and turn off when inverters 340A-B provide logic high output values.

Main switch transistors 370A and 370B are connected with power supply lines 125 and 135, respectively, as well as with reference voltage 120. Accordingly, each of main switch transistors 370A and 370B selectively provide reference voltage 120 to power supply lines 125 and 135, respectively, in response to signals 310A-B, 320, and 325.

In the particular implementation shown in FIG. 3, inverter 340A provides a logic low output at all times except when write data signal 310A, column select signal 320, and write enable 325 all exhibit logic high values. Similarly, inverter 340B provides a logic low output value at all times except when write data signal 310B, column select signal 320, and write enable 325 all exhibit logic high values. Accordingly, by adjusting signals 310A-B, 320, and 325, one or both of main switch transistors 370A-B turn on in response to signals 310A-B, 320, and 325. However, because write data signals 310A-B are implemented to provide differential data input values, at least one of main switch transistors 370A-B remains turned on.

Circuit 300 also includes clamper transistors 350A-C. The gates and drains of damper transistors 350A-B are connected with reference voltage 120. Accordingly, damper transistor 350A remains turned on and maintains a minimum voltage at power supply line 125 approximately equal to reference voltage 120 minus the threshold voltage of damper transistor 350A. Similarly, damper transistor 350B remains turned on and maintains a minimum voltage at power supply line 135 approximately equal to reference voltage 120 minus the threshold voltage of damper transistor 350B. Clamper transistor 350C includes a gate connected with reference voltage 120, a source connected with power supply line 125, and a drain connected with power supply line 135. Therefore, damper transistor 350C remains turned on and maintains a voltage difference between power supply lines 125 and 135 no greater than the threshold voltage of damper transistor 350C.

Accordingly, damper transistors 350A-C maintain minimum voltages at power supply lines 125 and 135 in the event that one of main switch transistors 370A or 370B turns off. Moreover, although three damper transistors 350A-C are illustrated in FIG. 3, it is contemplated that either damper transistor 350C or both of damper transistors 350A-B may be omitted in other embodiments.

Circuit 300 also includes weak keeper transistors 360A-C, each of which includes a gate connected with reference voltage 295 which is connected to ground in this embodiment. As a result, weak keeper transistors 360A and 360B remain turned on to provide weak current supplies which pull up the voltage of power supply lines 125 and 135, respectively. Weak keeper transistor 360C also remains turned on to provide a weak current flow between power supply lines 125 and 135. Accordingly, weak keeper transistors 360A-C adjust the voltage of power supply lines 125 and 135 in response to leakage currents of circuit 200. Although three weak keeper transistors 360A-C are illustrated in FIG. 3, it is contemplated that either weak keeper transistor 360C or both of weak keeper transistors 360A-B may be omitted in other embodiments.

Circuit 300 also includes write recovery transistors 380A-C having gates connected with signal 305. Accordingly, write recovery transistors 380A-C selectively turn on and off in response to signal 305. In the embodiment of FIG. 3, signal 305 normally provides a logic high value and is only set to a logic low value following a write operation as will be further described herein.

The operation of circuit 300 will now be described with reference to FIGS. 2 and 3. As identified above, the operation of main switch transistors 370A-B is determined by logic 390 in response to signals 310A-B, 320, and 325. In this regard, column select signal 320 provides a logic high value during read and write operations performed on circuit 200, and a logic low value at all other times. Write enable signal 325 is set to a logic high value only during write operations performed on circuit 200. Write data signals 310A-B provide differential data input values to be written into circuit 200. For example, if a first logic state is to be written into circuit 200, then data signal 310A is set to a logic high value, and data signal 310B is set to a logic low value. Similarly, if a second logic state is to be written, then data signal 310A is set to a logic low value, and data signal 310B is set to a logic high value.

As previously described with respect to split power switch 140, circuit 300 may be configured to maintain the voltage of each of power supply lines 125 and 135 approximately equal to reference voltage 120 except during write operations. In this regard, main switch transistor 370A remains turned on at all times except during write operations where data signal 310A provides a logic high value. Similarly, main switch transistor 370B remains turned on at all times except during write operations where data signal 310B provides a logic high value. Accordingly, while data values are maintained by SRAM cells 110 or read from SRAM cells 110, main switch transistors 370A-B of circuit 300 remain turned on. As a result, main switch transistors 370A-B maintain each of power supply lines 125 and 135 approximately equal to reference voltage 120.

However, during a write operation, column select signal 320 and write enable signal 325 provide logic high values. If the write operation calls for a first logic state to be written into SRAM cell 110, then write data signal 310A provides a logic high value and write data signal 310B provides a logic low value. As a result, inverter 340A provides a logic high value to the gate of main switch transistor 370A, thereby turning off main switch transistor 370A. However, because write data signal 310B remains low, inverter 340B continues to provide a logic low value to the gate of main switch transistor 370B, thereby keeping main switch transistor 370B turned on.

While transistor 370A is turned off, the voltage of power supply line 125 is permitted to drop. During this time, damper transistors 350A and 350C to maintain a minimum voltage at power supply line 125 approximately equal to reference voltage 120 minus their associated threshold voltages. As previously described with respect to FIG. 2, this drop in voltage improves the ability of bit line 280 to overcome transistor 230 and pull down node 265 during the write operation. In addition, by maintaining the voltage of power supply line 135 approximately equal to reference voltage 120 during the write operation, transistor 210 operates with sufficient current to pull up the voltage of node 255 in order to change circuit 200 to the desired logic state.

The voltage of power supply line 135 may be similarly adjusted during a second write operation that calls for a second logic state to be written into circuit 200. In this case, write data signal 310B is set to a logic high value and write data signal 310A is set to a logic low value. Here, transistor 370B turns off and the voltage of power supply line 135 drops down to a minimum voltage at power supply line 125 maintained by damper transistors 350B-C. As also previously described with respect to FIG. 2, this drop in voltage improves the ability of bit line 270 to overcome transistor 210 and pull down node 255 during the second write operation. In addition, by maintaining the voltage of power supply line 125 approximately equal to reference voltage 120 during the second write operation, transistor 230 operates with sufficient current to pull up the voltage of node 265 in order to change circuit 200 to the desired logic state.

As previously described, signal 305 normally provides a logic high value. However, signal 305 may be switched to a logic low value after a predetermined time period (for example, corresponding to the duration of a write operation) to pull power supply line 125 or 135 back up to reference voltage 120 in the event that signals 310A-B, 320, and 325 cause one of main switch transistors 370A-B to remain turned off following the write operation. For example, in one embodiment, after a write operation is completed (i.e., after circuit 200 has changed logic states), signal 305 may be set to a logic low value. In various embodiments, signal 305 may be implemented by a delay line that receives signals from word line 290, or by appropriate logic that mimics the predicted operation of circuit 200 during write operations.

Figure 4A:
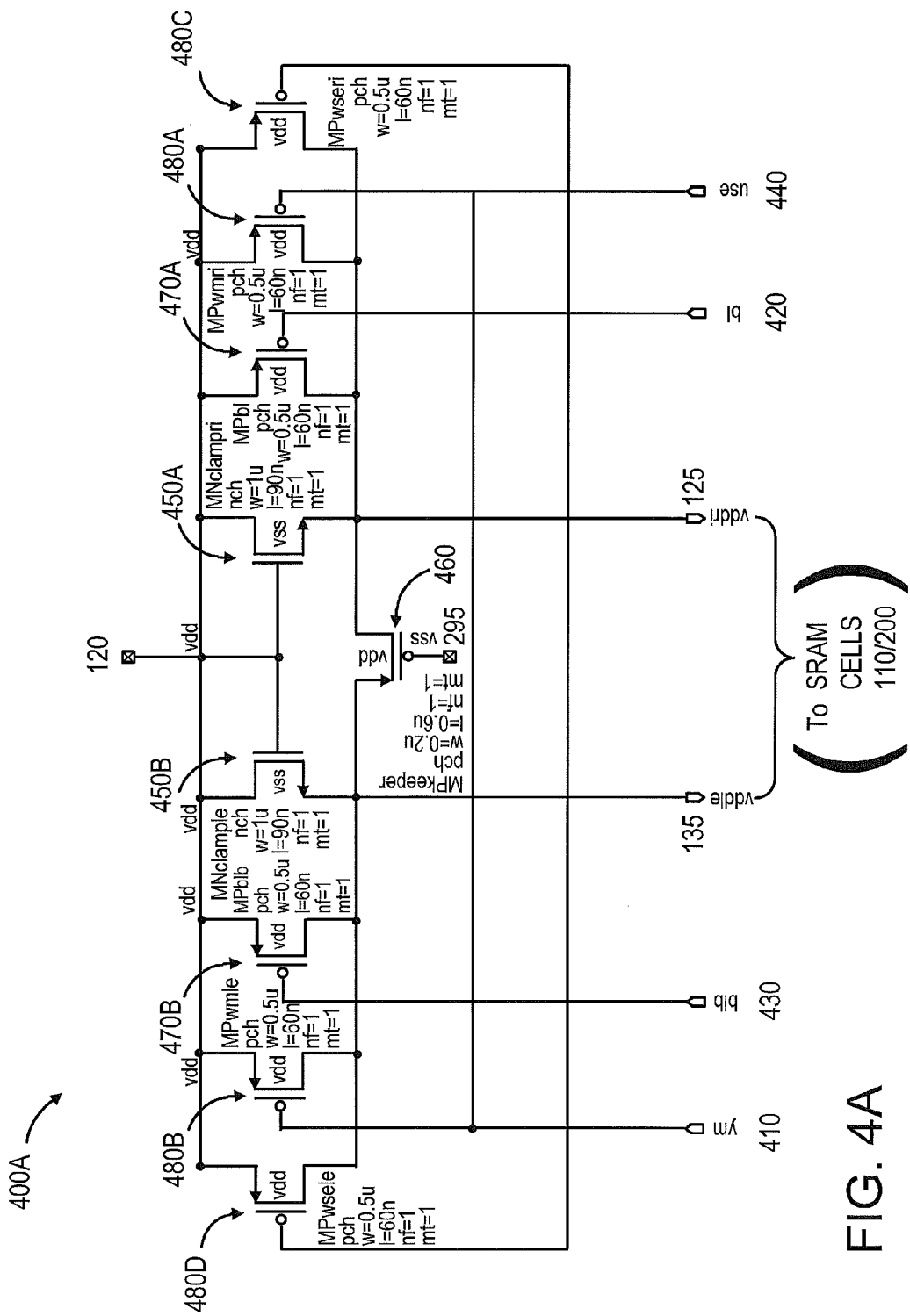

FIG. 4A illustrates a circuit 400A to implement split power switch 140 of FIG. 1 in accordance with another embodiment of the invention. As shown in FIG. 4A, circuit 400A may be connected with one or more of SRAM cells 110 (which may be implemented, for example, by one or more circuits 200) through power supply lines 125 and 135.

Circuit 400A is implemented to receive a plurality of signals including write recovery signals 410 and 440 (labeled ym and yse), and main switch signals 420 and 430 (labeled bl and blb). Signals 410, 420, 430, and 440 may be used to selectively adjust the voltages provided to power supply lines 125 and 135 as further described herein.

Circuit 400A includes main switch transistors 470A and 470B which are connected with power supply lines 125 and 135, respectively, as well as with reference voltage 120. In addition, the gates of main switch transistors 470A and 470B are connected with signals 420 and 430, respectively. Accordingly, each of main switch transistors 470A and 470B selectively provide reference voltage 120 to power supply lines 125 and 135 in response to signals 420 and 430, respectively.

Signals 420 and 430 may be operated through appropriate control circuitry (not shown) in a manner similar to logic 390 of FIG. 3 in order to provide logic low values at all times except during write operations at which time only one of signals 420 or 430 provides a logic high value. As a result, both of main switch transistors 470A and 470B remain turned on except during write operations, at which time one turns off to permit the voltage of one of power supply lines 125 or 135 to drop.

Circuit 400A also includes damper transistors 450A-B similar to damper transistors 350A-B of circuit 300 previously described above. As shown in FIG. 4A, the gates and drains of damper transistors 450A-B are connected with reference voltage 120. Accordingly, damper transistor 450A remains turned on and maintains a minimum voltage at power supply line 125 approximately equal to reference voltage 120 minus the threshold voltage of damper transistor 450A. Similarly, damper transistor 450B also remains turned on and maintains a minimum voltage at power supply line 135 approximately equal to reference voltage 120 minus the threshold voltage of damper transistor 450B. Accordingly, damper transistors 450A-B maintain minimum voltages at power supply lines 125 and 135 in the event that one of main switch transistors 470A or 470B turns off in response to signals 420 or 430.

Circuit 400A also includes weak keeper transistor 460 having its gate connected with reference voltage 295 which is connected to ground in this embodiment. As a result, weak keeper transistor 460 also remains turned on to provide a weak current flow between power supply lines 125 and 135 similar to weak keeper transistor 360C of circuit 300 previously described above. Accordingly, weak keeper transistor 460 adjusts the voltage of power supply lines 125 and 135 in response to leakage currents of circuit 200.

Circuit 400A also includes write recovery transistors 480A-B and 480C-D having gates connected with signals 410 and 440, respectively. Signals 410 and 440 may be operated and/or implemented in a manner similar to signal 305 of circuit 300 of FIG. 3. In this regard, signals 410 and 440 normally provide logic high values and are set to logic low values following a write operation as will be further described herein.

The operation of circuit 400A will now be described with reference to FIGS. 2 and 4A. As identified above, the operation of main switch transistors 470A-B is determined by signals 420 and 430, respectively. In this regard, signal 420 keeps main switch transistor 470A turned on at all times except during write operations to store a first logic state in circuit 200. Similarly, signal 430 keeps main switch transistor 470B turned on at all times except during write operations to store a second logic state in circuit 200. Accordingly, while a data value is maintained by circuit 200, or read from circuit 200, main switch transistors 470A-B remain turned on to keep each of power supply lines 125 and 135 approximately equal to reference voltage 120. However, during write operations one of main switch transistors 470A-B turn off.

If transistor 470A is turned off by signal 420 during a first write operation, the voltage of power supply line 125 will be permitted to drop. During this time, damper transistor 450A maintains a minimum voltage at power supply line 125 approximately equal to reference voltage 120 minus its associated threshold voltage. As previously described with respect to FIG. 2, this drop in voltage can improve the ability of bit line 280 to overcome transistor 230 and pull down node 265 during the write operation. In addition, by maintaining the voltage of power supply line 135 approximately equal to reference voltage 120 during the write operation, transistor 210 operates with sufficient current to pull up the voltage of node 255 in order to change circuit 200 to the desired logic state.

On the other hand, if transistor 470B is turned off by signal 430 during a second write operation, the voltage of power supply line 135 drops down to a minimum voltage at power supply line 135 maintained by clamper transistor 450B. As also previously described with respect to FIG. 2, this drop in voltage improves the ability of bit line 270 to overcome transistor 210 and pull down node 255 during the second write operation. In addition, by maintaining the voltage of power supply line 125 approximately equal to reference voltage 120 during the second write operation, transistor 230 operates with sufficient current to pull up the voltage of node 265 in order to change circuit 200 to the desired logic state.

Following a write operation, signals 410 and 440 are set to logic low values to turn on write recovery transistors 480A-D which are used to pull power supply line 125 or 135 back up to reference voltage 120 in the event that signal 420 or 430 causes one of main switch transistors 470A-B to remain turned off following the write operation.

Figure 4B:
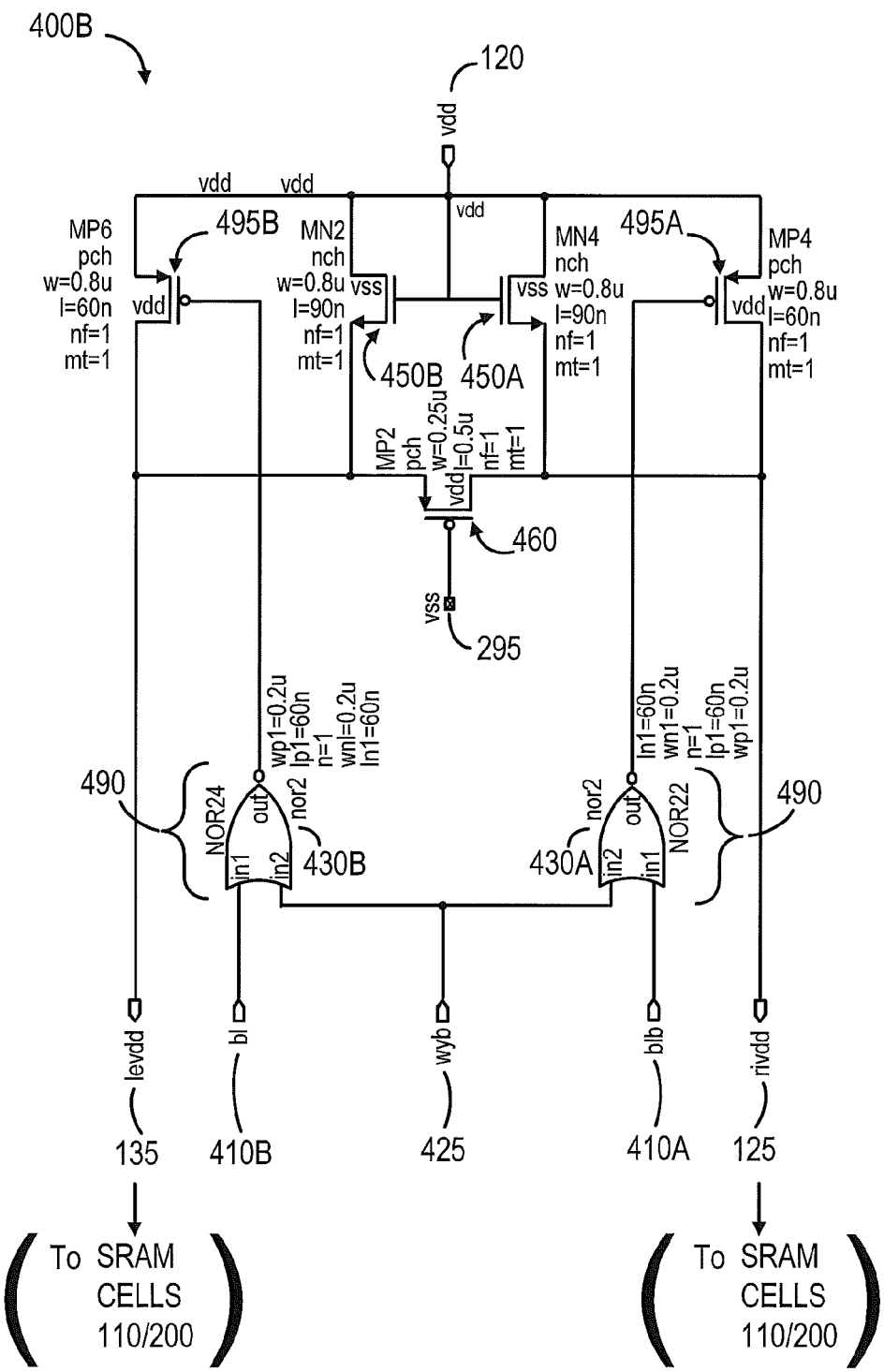

FIG. 4B illustrates a circuit 400B to implement split power switch 140 of FIG. 1 in accordance with another embodiment of the invention. As shown in FIG. 4B, circuit 400B may be connected with one or more of SRAM cells 110 (which may be implemented, for example, by one or more circuits 200) through power supply lines 125 and 135.

As also shown in FIG. 4B, circuit 400B includes various components of circuit 400A which operate in circuit 400B in the manner previously described herein. However, in circuit 400B, transistor 495A is used in place of main switch transistor 470A, write recovery transistor 480A, and write recovery transistor 480C of circuit 400A. Also in circuit 400B, transistor 495B is used in place of main switch transistor 470B, write recovery transistor 480B, and write recovery transistor 480D of circuit 400A.

Circuit 400B is implemented to receive a plurality of signals including write data signals 410A-B (labeled blb and b), and a write enable signal 425 (labeled wyb). Signals 410A-B and 425 are used to selectively adjust the voltages provided to power supply lines 125 and 135 as further described herein.

Circuit 400B includes logic 490 which may be implemented, for example, with NOR gates 430A-B. NOR gates 430A-B are connected with signals 410A-B and 425 as well as with the gates of transistors 495A-B. In this regard, the operation of transistors 495A-B is determined by logic 490 in response to signals 410A-B and 425. Specifically, transistors 495A-B turn on when NOR gates 430A-B provide logic low output values, and turn off when NOR gates 430A-B provide logic high output values.

Transistors 495A and 495B are connected with power supply lines 125 and 135, respectively, as well as with reference voltage 120. Accordingly, each of transistors 495A and 495B selectively provides reference voltage 120 to power supply lines 125 and 135, respectively, in response to signals 410A-B and 425.

In the particular implementation shown in FIG. 4B, NOR gate 430A provides a logic low output at all times except when write data signal 410A and write enable signal 425 both exhibit logic low values. Similarly, NOR gate 430B provides a logic low output value at all times except when write data signal 410B and write enable signal 425 both exhibit logic low values. Accordingly, by adjusting signals 410A-B and 425, one or both of transistors 495A-B turn on in response to signals 410A-B and 425. However, because write data signals 410A-B are implemented to provide differential data values, at least one of transistors 495A-B remains turned on. As a result, both of transistors 495A and 495B remain turned on except during write operations, at which time one turns off to permit the voltage of one of power supply lines 125 or 135 to drop.

The operation of circuit 400B will now be described with reference to FIGS. 2 and 4B. As identified above, the operation of transistors 495A-B is determined by logic 490 in response to signals 410A-B and 425. In this regard, write enable signal 425 provides a logic low value during write operations performed on circuit 200. Write data signals 410A-B provide differential data input values to be written into circuit 200. For example, if a first logic state is to be written into circuit 200, then data signal 410A is set to a logic low value, and data signal 410B is set to a logic high value. Similarly, if a second logic state is to be written, then data signal 410A is set to a logic high value, and data signal 410B is set to a logic low value.

Transistor 495A remains turned on at all times except during write operations where write enable signal 425 and data signal 410A provide logic low values. Similarly, transistor 495B remains turned on at all times except during write operations where write enable signal 425 and data signal 410B provide a logic low values. Accordingly, while data values are maintained by SRAM cells 110 or read from SRAM cells 110, transistors 495A-B of circuit 400 remain turned on. As a result, transistors 495A-B provide each of power supply lines 125 and 135 with reference voltage 120 or a reference current.

If transistor 495A is turned off by logic 490 in response to signal 410A and 425 during a first write operation, the voltage of power supply line 125 will be permitted to drop. During this time, weak keeper transistor 460 remains turned on to provide a weak current flow between power supply lines 125 and 135. Also during this time, damper transistor 450A maintains a minimum voltage at power supply line 125 approximately equal to reference voltage 120 minus its associated threshold voltage. As previously described with respect to FIG. 2, this drop in voltage can improve the ability of bit line 280 to overcome transistor 230 and pull down node 265 during the write operation. In addition, by maintaining the voltage of power supply line 135 approximately equal to reference voltage 120 during the write operation, transistor 210 operates with sufficient current to pull up the voltage of node 255 in order to change circuit 200 to the desired logic state.

On the other hand, if transistor 470B is turned off by logic 490 in response to signals 410B and 425 during a second write operation, the voltage of power supply line 135 drops down to a minimum voltage at power supply line 135 maintained by damper transistor 450B, and weak keeper transistor 460 remains turned on to provide a weak current flow between power supply lines 125 and 135. As also previously described with respect to FIG. 2, this drop in voltage improves the ability of bit line 270 to overcome transistor 210 and pull down node 255 during the second write operation. In addition, by maintaining the voltage of power supply line 125 approximately equal to reference voltage 120 during the second write operation, transistor 230 operates with sufficient current to pull up the voltage of node 265 in order to change circuit 200 to the desired logic state.

Figure 4C:
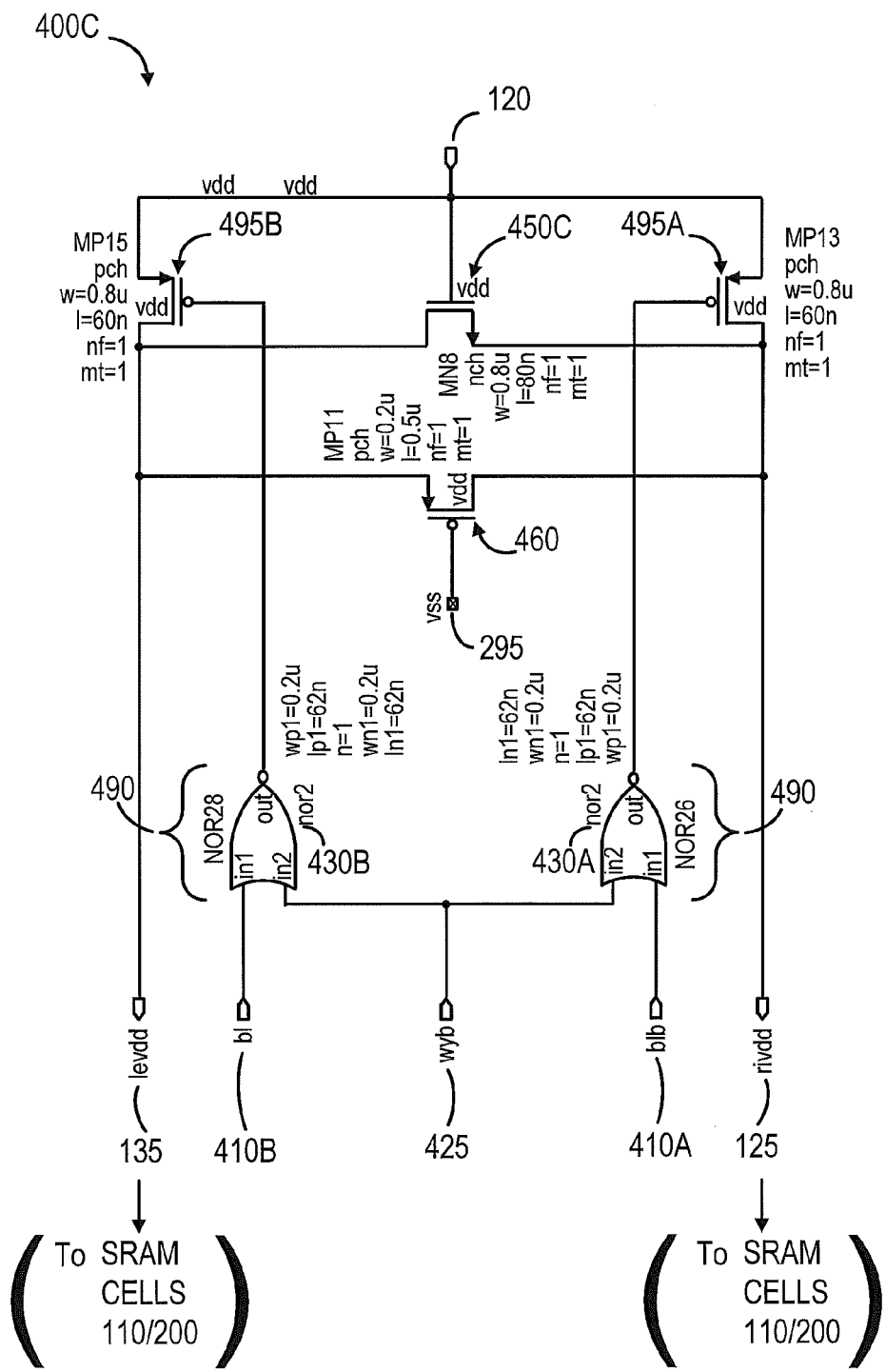

FIG. 4C illustrates a circuit 400C to implement split power switch 140 of FIG. 1 in accordance with another embodiment of the invention. As shown in FIG. 4C, circuit 400C may be connected with one or more of SRAM cells 110 (which may be implemented, for example, by one or more circuits 200) through power supply lines 125 and 135.

As also shown in FIG. 4C, circuit 400C includes various components of circuit 400B which operate in circuit 400C in the manner previously described herein. However, in circuit 400C, damper transistor 450C is used in place of damper transistors 450A-B. As shown in FIG. 4C, damper transistor 450C is connected with reference voltage 120, power supply line 125, and power supply line 135. Accordingly, damper transistor 450C remains turned on and prevents the voltage difference between power supply lines 125 and 135 from exceeding a minimum voltage corresponding to the threshold voltage of damper transistor 450C during write operations when one of transistors 495A-B is turned off.

Figure 5:
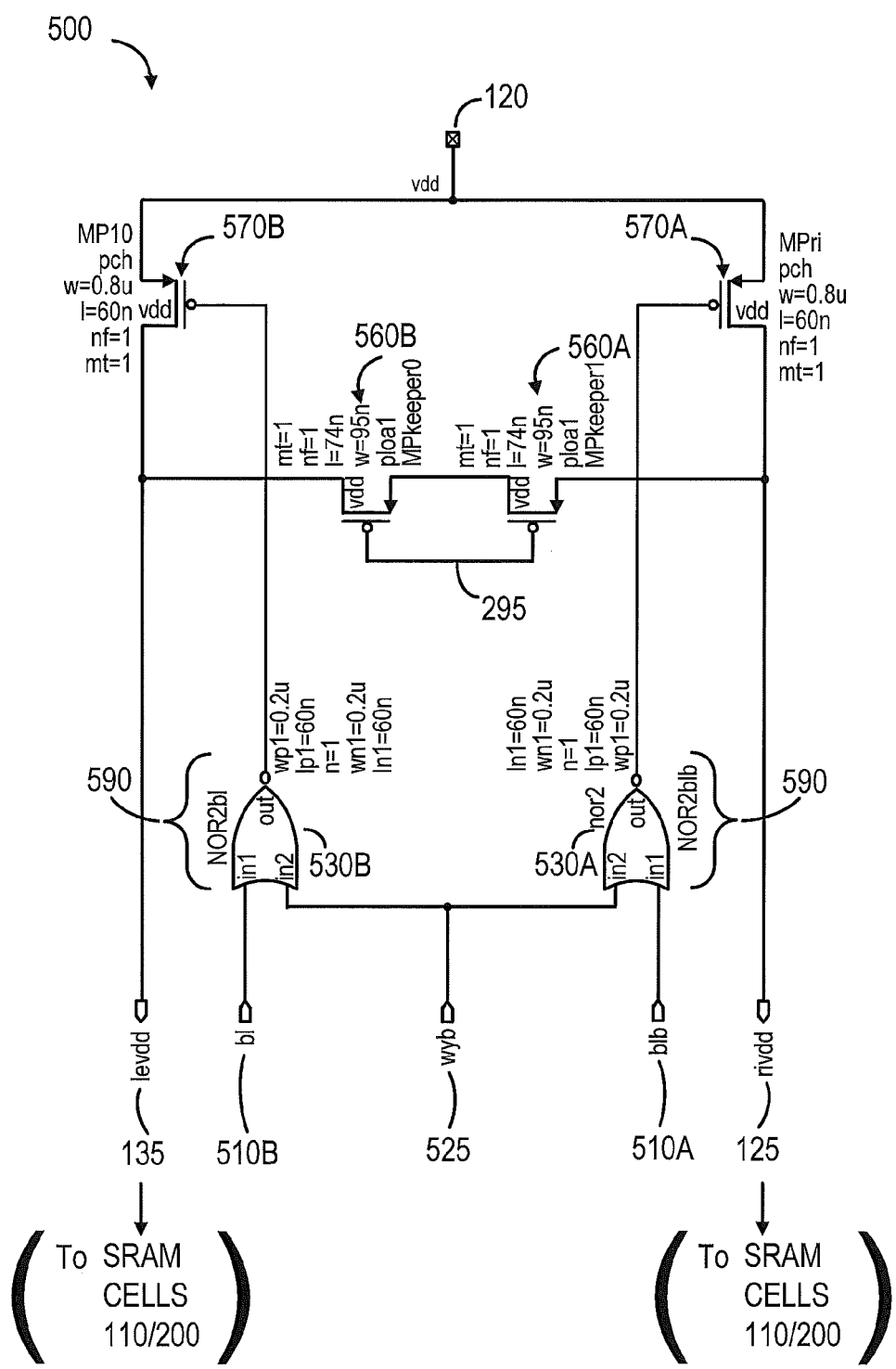

FIG. 5 illustrates a circuit 500 to implement split power switch 140 of FIG. 1 in accordance with an embodiment of the invention. As shown in FIG. 5, circuit 500 may be connected with one or more of SRAM cells 110 (which may be implemented, for example, by one or more circuits 200) through power supply lines 125 and 135.

Circuit 500 is implemented to receive a plurality of signals including write data signals 510A-B (labeled blb and b), and a write enable signal 525 (labeled wyb). Signals 510A-B and 525 are used to selectively adjust the voltages provided to power supply lines 125 and 135 as further described herein.

Circuit 500 includes logic 590 which may be implemented, for example, with NOR gates 530A-B. NOR gates 530A-B are connected with signals 510A-B and 525 as well as with the gates of main switch transistors 570A-B. In this regard, the operation of main switch transistors 570A-B is determined by logic 590 in response to signals 510A-B and 525. Specifically, main switch transistors 570A-B turn on when NOR gates 530A-B provide logic low output values, and turn off when NOR gates 530A-B provide logic high output values.

Main switch transistors 570A and 570B are connected with power supply lines 125 and 135, respectively, as well as with reference voltage 120. Accordingly, each of main switch transistors 570A and 570B selectively provides reference voltage 120 to power supply lines 125 and 135, respectively, in response to signals 510A-B and 525.

In the particular implementation shown in FIG. 5, NOR gate 530A provides a logic low output at all times except when write data signal 510A and write enable signal 525 both exhibit logic low values. Similarly, NOR gate 530B provides a logic low output value at all times except when write data signal 510B and write enable signal 525 both exhibit logic low values. Accordingly, by adjusting signals 510A-B and 525, one or both of main switch transistors 570A-B turn on in response to signals 510A-B and 525. However, because write data signals 510A-B are implemented to provide differential data values, at least one of main switch transistors 570A-B remains turned on.

Circuit 500 also includes weak keeper transistors 560A-B, each of which includes a gate connected with reference voltage 295 which is connected to ground in this embodiment. As a result, weak keeper transistors 560A and 560B remain turned on to provide a weak current flow between power supply lines 125 and 135. Accordingly, weak keeper transistors 560A-B adjust the current provided to power supply lines 125 and 135, and weakly pull up the voltage of power supply line 125 or 135 in the event that main switch transistor 570A or 570B, respectively, is turned off. Although two weak keeper transistors 560A-B are illustrated in FIG. 5, it is contemplated that greater or lesser numbers of weak keeper transistors may be provided in other embodiments. In one embodiment, each of weak keeper transistors 560A-B is sized to approximately correspond to sizes of individual PMOS transistors of circuit 200.

The operation of circuit 500 will now be described with reference to FIGS. 2 and 5. As identified above, the operation of main switch transistors 570A-B is determined by logic 590 in response to signals 510A-B and 525. In this regard, write enable signal 525 provides a logic low value during write operations performed on circuit 200. Write data signals 510A-B provide differential data input values to be written into circuit 200. For example, if a first logic state is to be written into circuit 200, then data signal 510A is set to a logic low value, and data signal 510B is set to a logic high value. Similarly, if a second logic state is to be written, then data signal 510A is set to a logic high value, and data signal 510B is set to a logic low value.

Main switch transistor 570A remains turned on at all times except during write operations where write enable signal 525 and data signal 510A provide logic low values. Similarly, main switch transistor 570B remains turned on at all times except during write operations where write enable signal 525 and data signal 510B provide logic low values. Accordingly, while data values are maintained by SRAM cells 110 or read from SRAM cells 110, main switch transistors 570A-B of circuit 500 remain turned on. As a result, main switch transistors 570A-B provide each of power supply lines 125 and 135 with reference voltage 120 or a reference current.

However, during a write operation, write enable signal 525 provides a logic low value. If the write operation calls for a first logic state to be written into SRAM cell 110, then write data signal 510A provides a logic low value and write data signal 510B provides a logic high value. As a result, NOR gate 530A provides a logic high value to the gate of main switch transistor 570A, thereby turning off main switch transistor 570A. However, because write data signal 510B remains high, NOR gate 530B continues to provide a logic low value to the gate of main switch transistor 570B, thereby keeping main switch transistor 570B turned on.

While transistor 570A is turned off, the current provided to power supply line 125 is reduced to a minimum current provided by weak keeper transistors 560A-B. This reduction in current improves the ability of bit line 280 to overcome transistor 230 and pull down node 265 during the write operation performed on circuit 200. In addition, by continuing to provide a greater current to power supply line 135 during the write operation, transistor 210 operates with sufficient current to pull up the voltage of node 255 in order to change circuit 200 to the desired logic state.

The current provided to power supply line 135 may be similarly adjusted during a second write operation that calls for a second logic state to be written into circuit 200. In this case, write enable signal 525 and write data signal 510B are set to a logic low values and write data signal 510A is set to a logic low value. Here, transistor 570B turns off and the current provided to power supply line 135 drops to the minimum current provided by weak keeper transistors 560A-B. This drop in current improves the ability of bit line 270 to overcome transistor 210 and pull down node 255 during the second write operation. In addition, by continuing to provide greater current to power supply line 125 during the second write operation, transistor 230 operates with sufficient current to pull up the voltage of node 265 in order to change circuit 200 to the desired logic state.

Figure 6:
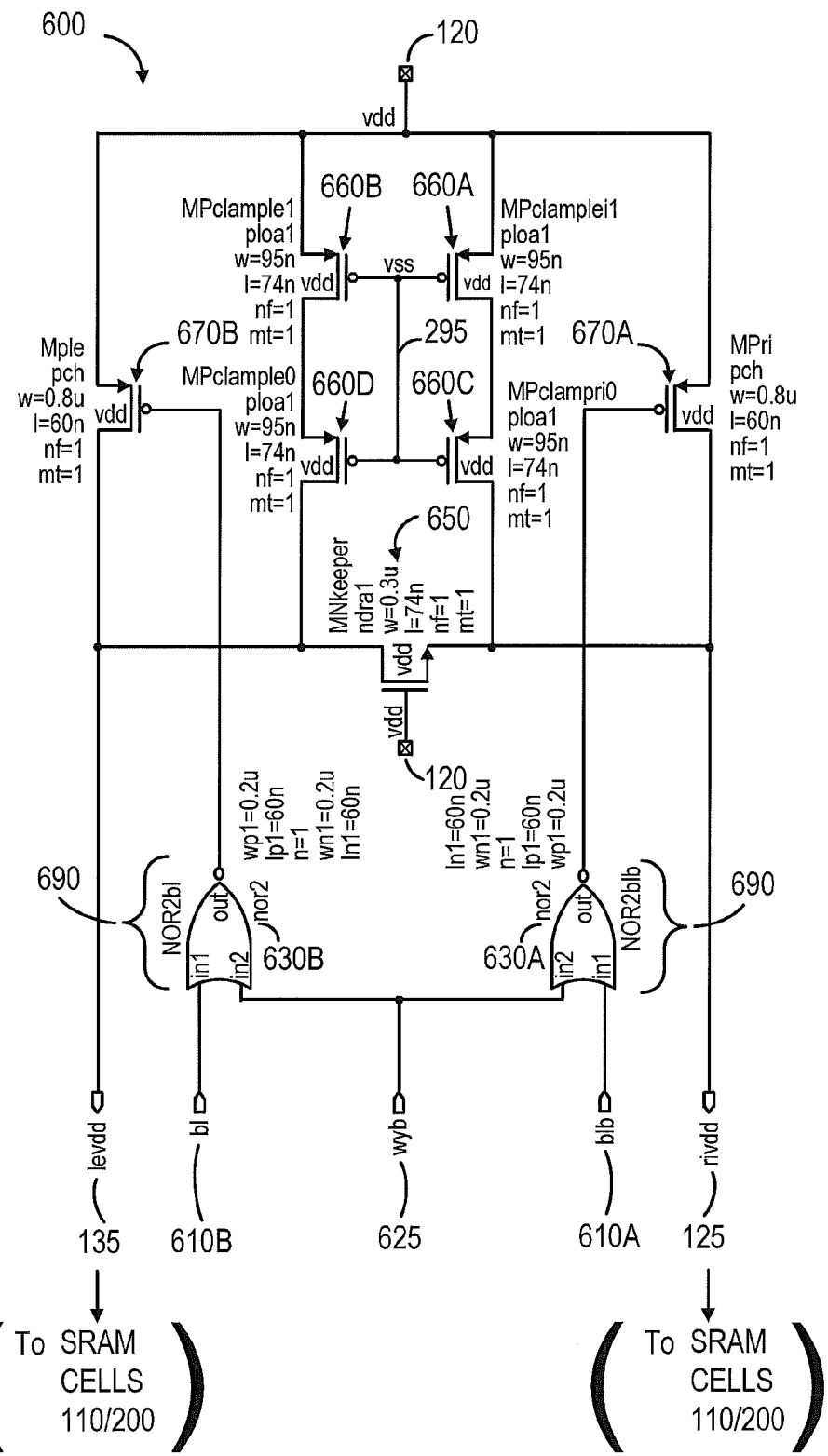

FIG. 6 illustrates a circuit 600 to implement split power switch 140 of FIG. 1 in accordance with an embodiment of the invention. As shown in FIG. 6, circuit 600 may be connected with one or more of SRAM cells 110 (which may be implemented, for example, by one or more circuits 200) through power supply lines 125 and 135. Circuit 600 includes write data signals 610A-B (labeled bib and b), a write enable signal 625 (labeled wyb), logic 690, NOR gates 630A-B, and main switch transistors 670A-B implemented in a manner as previously described with regard to corresponding portions of circuit 500 of FIG. 5. Signals 610A-B and 625 may be used to selectively adjust the voltages provided to power supply lines 125 and 135 as further described herein.

Circuit 600 also includes damper transistor 650 which has a gate connected with reference voltage 120, a source connected with power supply line 125, and a drain connected with power supply line 135. Therefore, damper transistor 650 remains turned on and maintains a voltage difference between power supply lines 125 and 135 no greater than the threshold voltage of damper transistor 650. Accordingly, damper transistor 650 maintains minimum voltages at power supply lines 125 and 135 in the event that one of main switch transistors 670A or 670B is turned off. It is contemplated that other numbers of damper transistors may be provided in other embodiments.

Circuit 600 also includes weak keeper transistors 660A-D, each of which includes a gate connected with reference voltage 295 which is connected to ground in this embodiment. As shown, weak keeper transistors 660A-B are connected with reference voltage 120, and weak keeper transistors 660C-D are connected with power supply lines 125 and 135. Accordingly, weak keeper transistors 660A-D remain turned on to provide weak current supplies which pull up the voltage of power supply lines 125 and 135, respectively in response to leakage currents of circuit 200. It is contemplated that other numbers of weak keeper transistors may be provided in other embodiments. In one embodiment, each of weak keeper transistors 660A-D are sized to approximately correspond to sizes of individual PMOS transistors of circuit 200.

The operation of circuit 600 will now be described with reference to FIGS. 2 and 6. The operation of main switch transistors 670A-B is determined by logic 690 in response to signals 610A-B and 625 as similarly described above in relation to circuit 500 of FIG. 5. Accordingly, circuit 600 may be configured to maintain the voltage of each of power supply lines 125 and 135 approximately equal to reference voltage 120 except during write operations. During a write operation, write enable signal 625 provides a logic low value. If the write operation calls for a first logic state to be written into SRAM cell 110, then write data signal 610A provides a logic low value and write data signal 610B provides a logic high value. As a result, NOR gate 630A provides a logic high value to the gate of main switch transistor 670A, thereby turning off main switch transistor 670A. However, because write data signal 610B remains high, NOR gate 630B continues to provide a logic low value to the gate of main switch transistor 670B, thereby keeping main switch transistor 670B turned on.

While transistor 670A is turned off, the voltage of power supply line 125 will be permitted to drop. During this time, damper transistor 650 maintains a minimum voltage at power supply line 125 approximately equal to reference voltage 120 minus the threshold voltage of damper transistor 650. This drop in voltage improves the ability of bit line 280 to overcome transistor 230 and pull down node 265 during the write operation. In addition, by maintaining the voltage of power supply line 135 approximately equal to reference voltage 120 during the write operation, transistor 210 operates with sufficient current to pull up the voltage of node 255 in order to change circuit 200 to the desired logic state.

The voltage of power supply line 135 may be similarly adjusted during a second write operation that calls for a second logic state to be written into circuit 200. In this case, write enable signal 625 and write data signal 610B are set to logic low values and write data signal 610A is set to a logic high value. Here, transistor 670B turns off and the voltage of power supply line 135 will be permitted to drop down to a minimum voltage at power supply line 125 maintained by damper transistor 650. This drop in voltage improves the ability of bit line 270 to overcome transistor 210 and pull down node 255 during the second write operation. In addition, by maintaining the voltage of power supply line 125 approximately equal to reference voltage 120 during the second write operation, transistor 230 operates with sufficient current to pull up the voltage of node 265 in order to change circuit 200 to the desired logic state.

Figure 7:
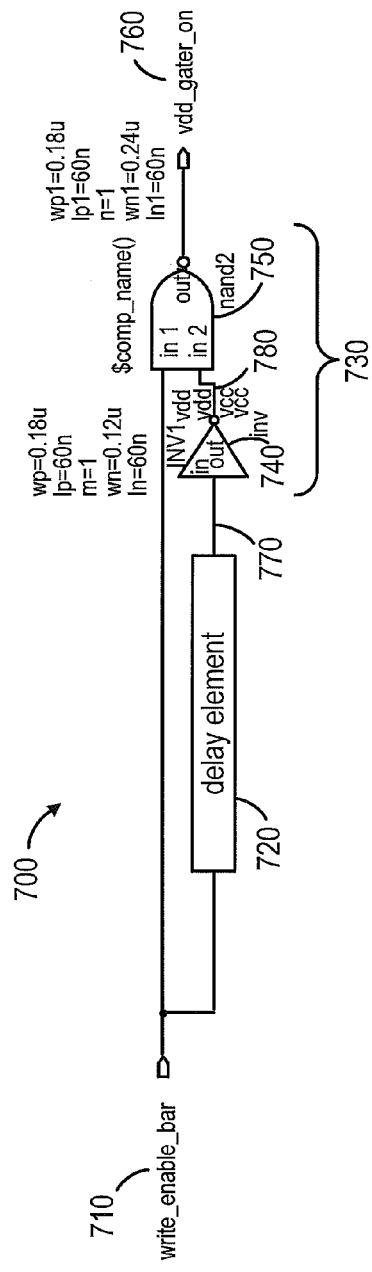
FIG. 7 illustrates a circuit to provide a write recovery signal to a split power switch in accordance with an embodiment of the invention.

FIG. 7 illustrates a circuit 700 to provide a write recovery signal to a split power switch in accordance with an embodiment of the invention. Circuit 700 includes a delay element block 720 implemented by appropriate circuitry to delay an input signal to provide a delayed signal. Circuit 700 also includes logic 730 implemented in the illustrated embodiment by an inverter 740 and a NAND gate 750.

Delay element block 720 and NAND gate 750 each receive an input signal 710 (labeled write_enable_bar) which may be implemented, for example, as an inverted version of write enable signal 325 described herein. Delay element block 720 delays input signal 710 to provide a delayed signal 770. Delayed signal 770 is inverted by inverter 740 to provide an inverted delayed signal 780 to NAND gate 750. Accordingly, inverted delayed signal 780 corresponds, for example, to a delayed version of write enable signal 325. NAND gate operates on signals 710 and 780 to provide a write recovery signal 760 (labeled vdd_gater_on) that may be used to implement any of write recovery signals 305, 410, or 440 described herein.

Embodiments incorporating various features disclosed herein may be implemented in embedded or standalone SRAM memory devices, caches, register files, multi-port memories, translation lookaside buffers (TLBS), content-addressable memories (CAMS), ternary CAMS (TCAMS), or other appropriate devices to operate at lower voltages as compared to traditional six transistor SRAM cells. Such features can be particularly advantageous for mobile, portable, or ultra-low voltage devices in which lower supply voltages may advantageously permit longer battery life and/or use time.

Figure 8:
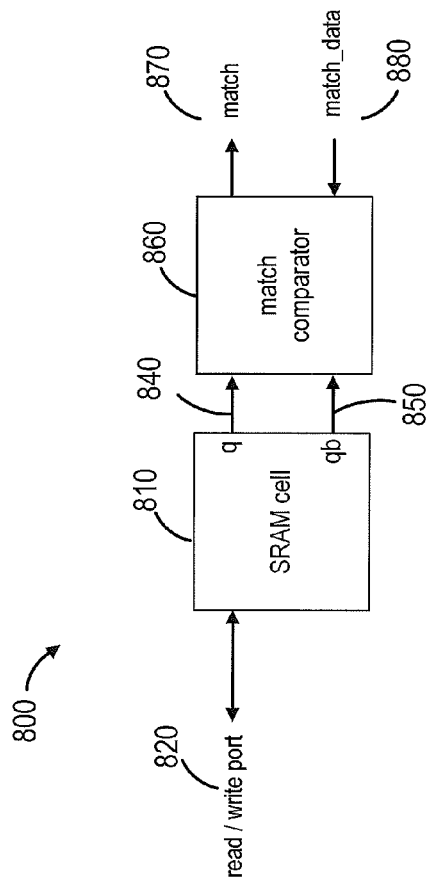
FIG. 8 illustrates an example of a memory device including an SRAM cell in accordance with an embodiment of the invention.

For example, FIG. 8 illustrates an example of a memory device that may be implemented with one or more of the various SRAM cell circuits disclosed herein. In this regard, illustrates a CAM memory device 800 including an SRAM cell 810 and a match comparator 860 in block form. For example, in one embodiment, SRAM cell 810 may be implemented by circuit 200 of FIG. 2. As shown, SRAM cell 810 includes a read/write port 820 implemented by appropriate read and write circuitry. For example, in one embodiment, read/write port 820 is implemented by access transistors 250 and 260 of circuit 200. Logic states stored by SRAM cell 810 are provided to match comparator 860 over complementary data output lines 840 and 850 which may, for example, be connected with bit lines 270 and 280, respectively of circuit 200.

Match comparator 860 is implemented with appropriate circuitry known in the art to compare a data value received at an input port 880 (labeled match_data) with logic states received from data output line 840 and/or 850. Match comparator 860 provides an appropriate data signal through output port 870 (labeled match) to indicate the existence of a match or non-match between the data value received at input port 880 and the logic state stored by SRAM cell 810. Other implementations and applications of SRAM cell circuits in accordance with various embodiments described herein are also contemplated.

Figure 9:
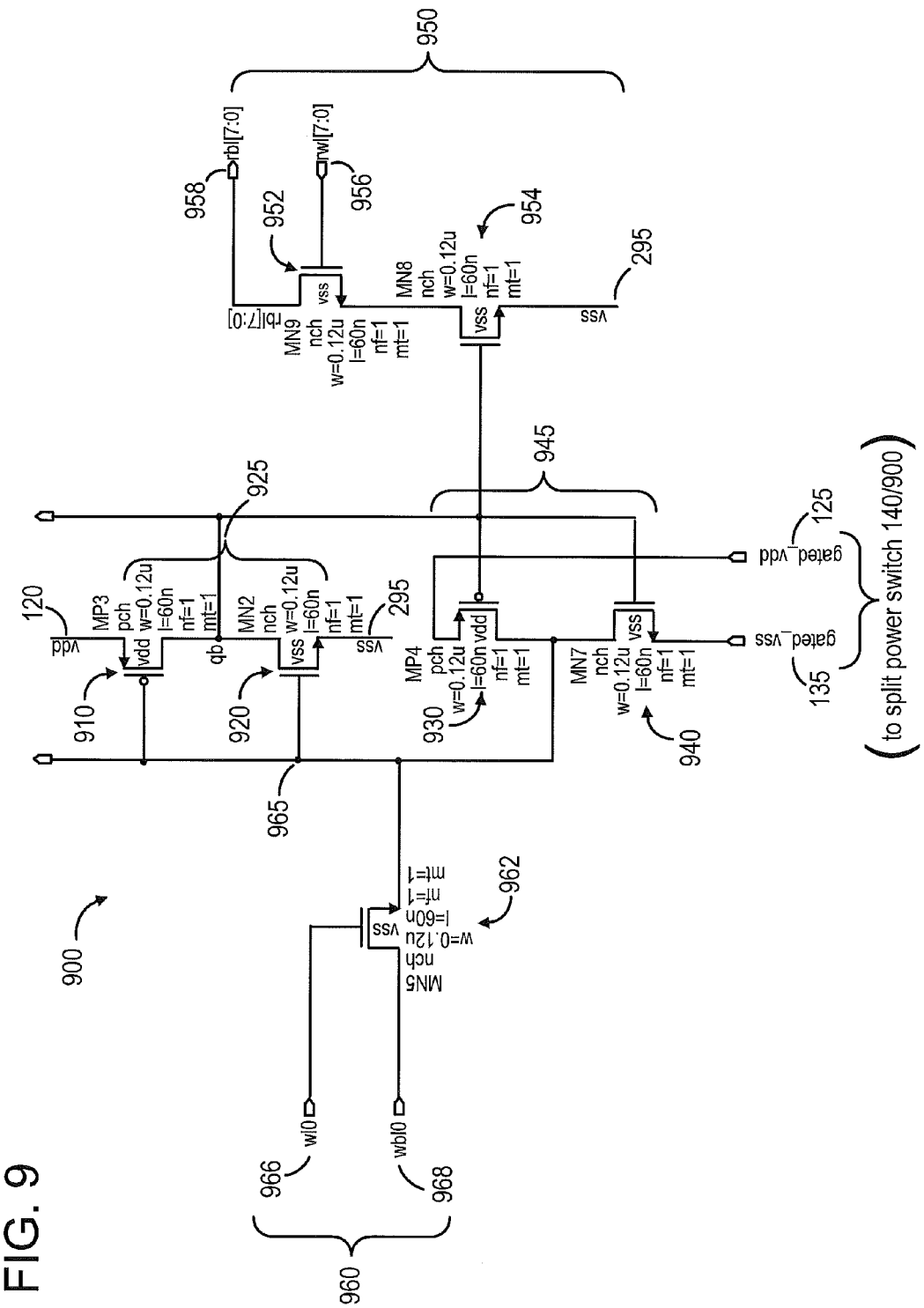
FIG. 9 illustrates another circuit to implement an SRAM cell in accordance with an embodiment of the invention
Figure 10:
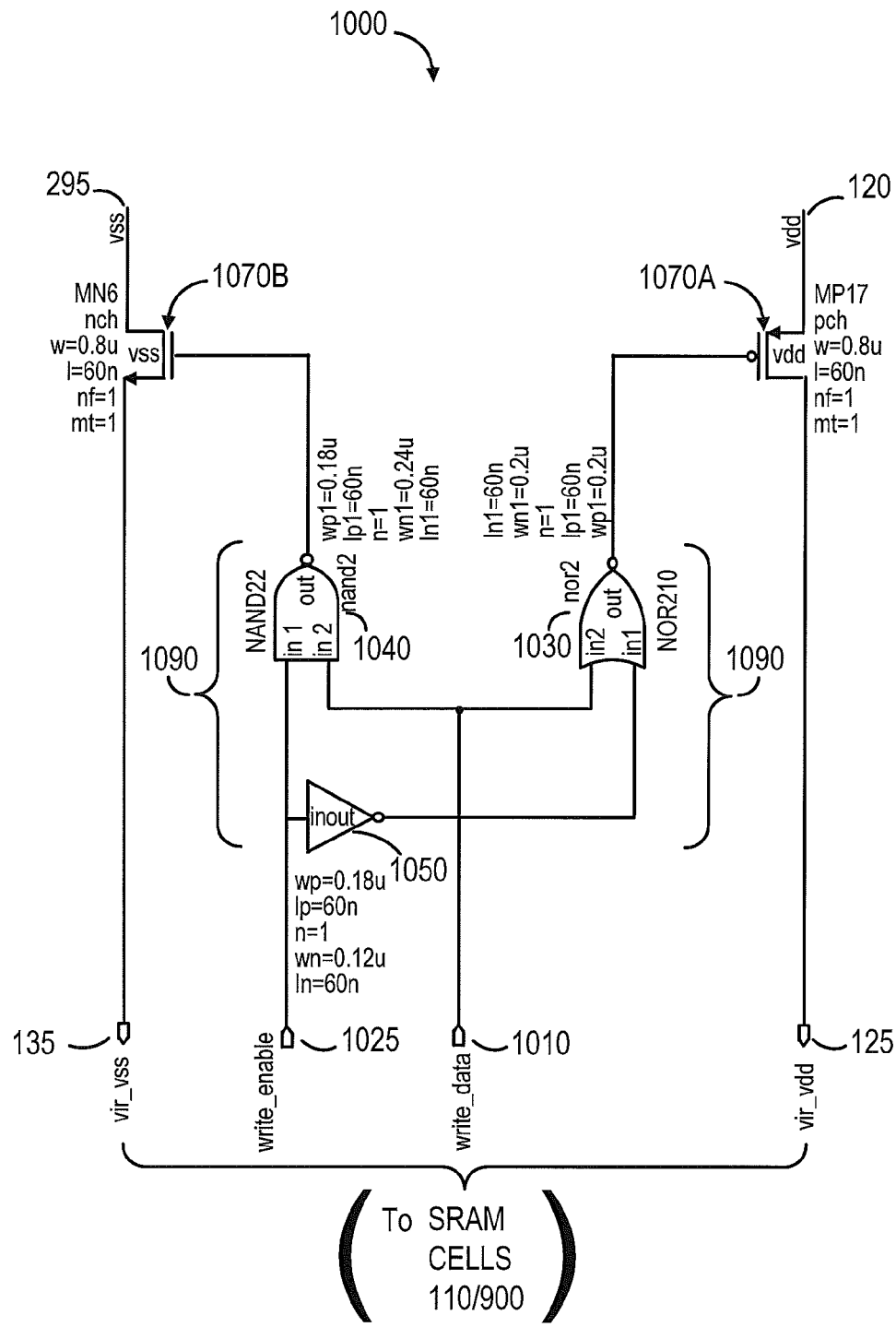
FIG. 10 illustrates another circuit to implement a split power switch in accordance with an embodiment of the invention.

FIG. 9 illustrates another circuit 900 to implement an SRAM cell in accordance with an embodiment of the invention. FIG. 10 illustrates another circuit 1000 to implement a split power switch in accordance with an embodiment of the invention. Similar to circuit 200 described herein, circuit 900 is connected with power supply lines 125 and 135. However, in circuit 900, power supply lines 125 and 135 are connected with circuit 1000 of FIG. 10.

As shown in FIG. 9, circuit 900 includes a pair of cross-coupled inverters 925 and 945 implemented by transistors 910/920 and 930/940, respectively, which may be used to store a first logic state or a second logic state corresponding to voltages maintained at nodes 925 and 965.

Transistor 910 is connected with reference voltage 120 (labeled Vdd), and transistor 920 is connected with reference voltage 295 (labeled Vss). Transistor 930 is connected with power supply line 125 (labeled gated_vdd in this embodiment), and transistor 940 is connected with power supply line 135 (labeled gated_vss in this embodiment).

Circuit 900 includes a plurality of read ports 950 which are implemented as single ended read ports in the embodiment of FIG. 9. In particular, eight read ports 950 are connected with node 992 of circuit 900. However, any desired number of single ended or differential read ports may be provided in other embodiments.

In the embodiment shown in FIG. 9, read ports 950 are implemented by a plurality of transistors 952 (labeled MN9 [7:0]), which are connected with transistor 954. In this regard, although transistors 952 are illustrated by a single transistor in FIG. 9, eight of transistors 952 (corresponding to MN9[0] through MN9[7]) are provided in circuit 900. Each of transistors 952 is connected with transistor 954. In another embodiment (not shown), a plurality of transistors 954 may be provided, with each of transistors 954 connected with a corresponding one of transistors 952.

As shown in FIG. 9, the gate of transistor 954 is connected with node 992 of circuit 900. Accordingly, transistor 954 turns on if node 992 is set to a logic high voltage greater than the threshold voltage of transistor 954. Similarly, transistor 954 turns off if node 992 is set to a logic low voltage lower than the threshold voltage of transistor 954.

Each of transistors 952 is connected with a corresponding one of read word lines 956 (labeled rwl[7:0]) and a corresponding one of read data lines 958 (labeled rbl[7:0]) which are used to read logic states stored by circuit 900. For example, if one of read word lines 956 is set to a logic high value, its associated transistor 952 turns on. If node 992 is set to a logic high value, transistor 954 also turns on. In this case, the combined operation of transistors 952 and 954 pull the associated read data line 958 down to a logic low value that is detected as a first logic state by appropriate read circuitry, such as a sense amplifier (not shown) connected with the associated read data line 958. If node 992 is set to a logic low value, transistor 954 turns off. As a result, the associated read data line 958 is not pulled down which is detected as a second logic state.

Circuit 900 is also implemented with a single ended write port 960. However, any desired number of single ended or differential read ports may be provided in other embodiments. In the embodiment shown in FIG. 9, write port 960 is implemented by a transistor 962. As shown in FIG. 9, transistor 962 is connected with node 965, a write word line 966, and a write data line 968 which provides data values corresponding to logic states to be written into circuit 900 during write operations. Accordingly, transistor 962 pulls node 965 down to a logic low voltage if write word line 966 and write data line 968 are set to logic high values. At other times, when write operations are not being performed, write data line 968 may be set to a logic low value.

Although circuit 900 includes read ports 950 and write port 960, circuit 900 may alternatively be implemented with one or more bidirectional read/write ports. For example, in one embodiment, circuit 900 may include a single bidirectional read/write port implemented by an appropriate pass gate. In another embodiment, circuit 900 may include multiple bidirectional read/write ports implemented by multiple pass gates.

While circuit 900 is storing a given logic state, split power switch 1000 maintains the voltage of each of power supply lines 125 and 135 approximately equal to reference voltages 120 and 295, respectively. For example, if circuit 900 is storing a first logic state (e.g., corresponding to a data value of 0), node 955 may be set to a logic low voltage while node 965 is set to a logic high voltage. Accordingly, transistors 920 and 930 will be turned on, and transistors 910 and 940 will be turned off. In this case, because the voltage of power supply line 125 is approximately equal to reference voltage 120, transistor 930 pulls up the voltage of node 965 to maintain the first logic state.

Similarly, if circuit 900 is storing a second logic state (e.g., corresponding to a data value of 1), node 965 may be set to a logic low voltage while node 955 is set to a logic high voltage. Accordingly, transistors 910 and 940 turn on, and transistors 920 and 930 turn off. In this second case, because the voltage of power supply line 135 is also equal to reference voltage 295, transistor 940 pulls down the voltage of node 965 to maintain the second logic state.

Split power switch 1000 continues to maintain the voltage of each of power supply lines 125 and 135 approximately equal to reference voltages 120 and 295, respectively, during read operations.

However, during a write operation to switch circuit 900 from a first logic state to a second logic state, split power switch 1000 permits the voltage of power supply line 125 to fall below reference voltage 120 while continuing to maintain the voltage of power supply line 135 approximately equal to reference voltage 295. In this example, nodes 955 and 965 are initially set to logic low and high voltages, respectively, transistors 920 and 930 turn on, and transistors 910 and 940 turn off while circuit 900 initial stores the first logic state. During the write operation to store the second logic state into circuit 900, write word line 966 and write data line 968 are driven high and low, respectively by appropriate write circuitry (not shown). Accordingly, write data line 968 pulls node 965 down from a logic high voltage to a logic low voltage. As described above, because transistor 930 is turned on, it will continue to attempt to pull up the voltage of node 965. However, by permitting the voltage of power supply line 125 to fall below reference voltage 120 during the write operation, transistor 930 operates with less current, thereby improving the ability of write data line 968 to overcome transistor 930 and pull down node 965.

When node 965 is pulled below the threshold voltage of transistor 910, transistor 910 turns on and pulls up the voltage of node 955. By maintaining the voltage of power supply line 135 approximately equal to reference voltage 295 during the write operation, transistor 940 operates with sufficient current to pull down the voltage of node 965 in order to change circuit 900 to the second logic state.

During a second write operation to switch circuit 900 from the second logic state to the first logic state, write word line 966 and write data line 968 are both driven high by appropriate write circuitry (not shown). Accordingly, write data line 968 pulls node 965 up from a logic low voltage to a logic high voltage.

Also during this second write operation, split power switch 1000 permits the voltage of power supply line 135 to rise above reference voltage 135 while continuing to maintain the voltage of power supply line 125 approximately equal to reference voltage 120. In this case, transistor 940 operates with less current, thereby improving the ability of write data line 968 to overcome transistor 940 and pull up node 965. Optionally, in another embodiment, the voltage of power supply line 125 may be maintained approximately equal to reference voltage 120 during both the first and second write operations.

Referring now to FIG. 10, circuit 1000 is implemented to receive a plurality of signals including a write data signal 1010 (labeled write_data) and a write enable signal 1025 (labeled write_enable). Signals 1010 and 1025 are used to selectively adjust the voltages provided to power supply lines 125 and 135 through main switch transistors 1070A and 1070B, respectively, as further described herein.

Circuit 1000 includes logic 1090 which may be implemented, for example, with a NOR gate 1030, a NAND gate 1040, and an inverter 1050. NOR gate 1030 is connected with write data signal 1010, an inverted version of write enable signal 1025 (e.g., inverted by inverter 1050), and the gate of main switch transistor 1070A. NAND gate 1040 is connected with write data signal 1010, write enable signal 1025, and the gate of main switch transistor 1070B.

In this regard, the operation of main switch transistors 1070A-B is determined by logic 1090 in response to signals 1010 and 1025. For example, if write enable signal 1025 provides a logic low value, both of main switch transistors 1070A-B turn on. If write enable signal 1025 provides a logic high value and write data signal provides a logic low value, main switch transistor 1070A turns off and main switch transistor 1070A turns on. If write enable signal 1025 and write data signal provides both provide logic high values, main switch transistor 1070B turns off and main switch transistor 1070A turns on.

Main switch transistors 1070A and 1070B are connected with power supply lines 125 and 135, respectively, as well as with reference voltages 120 and 295, respectively. Accordingly, main switch transistors 1070A and 1070B selectively provide reference voltages 120 and 295 to power supply lines 125 and 135, respectively, in response to signals 1010 and 1025.

The operation of circuit 1000 will now be described with reference to FIGS. 9 and 10. As identified above, the operation of main switch transistors 1070A-B is determined by logic 1090 in response to signals 1010 and 1025. In this regard, write enable signal 1025 provides a logic high value during write operations performed on circuit 900. Write data signal 1010 provides data input values to be written into circuit 900. For example, if a first logic state is to be written into circuit 900, then write data signal 1010 is set to a logic low value. Similarly, if a second logic state is to be written, then write data signal 1010 is set to a logic high value.

Main switch transistor 1070A remains turned on at all times except during write operations where write data signal 1010 provides a logic low value and write enable signal 1025 provides a logic high value. Similarly, main switch transistor 1070B remains turned on at all times except during write operations where write data signal 1010 provides a logic high value and write enable signal 1025 provides a logic high value. Accordingly, while data values are maintained by circuit 900 or read from circuit 900, main switch transistors 1070A-B of circuit 1000 remain turned on. As a result, main switch transistors 1070A-B provide power supply lines 125 and 135 with reference voltages 120 and 295, respectively or a an appropriate reference current.

However, during a write operation, write enable signal 1025 provides a logic high value. If the write operation calls for a first logic state to be written into circuit 900, then write data signal 1010 provides a logic high value. As a result, NAND gate 1040 provides a logic low value to the gate of main switch transistor 1070B, thereby turning off main switch transistor 1070B. However, NOR gate 1030 continues to provide a logic high value to the gate of main switch transistor 1070A, thereby keeping main switch transistor 1070A turned on.

While transistor 1070B is turned off and transistor 1070A is turned on, split power switch 1000 permits the voltage of power supply line 135 to rise above reference voltage 295 while continuing to maintain the voltage of power supply line 125 approximately equal to reference voltage 120. In this case, transistor 940 operates with reduced current, thereby improving the ability of write data line 968 to overcome transistor 940 and pull up node 965 as previously described.

If the write operation calls for a second logic state to be written into circuit 900, then write data signal 1010 provides a logic low value. As a result, NOR gate 1030 provides a logic low value to the gate of main switch transistor 1070A, thereby turning off main switch transistor 1070A. However, NAND gate 1040 continues to provide a logic high value to the gate of main switch transistor 1070B, thereby keeping main switch transistor 1070B turned on.

While transistor 1070A is turned off and transistor 1070B is turned on, split power switch 1000 permits the voltage of power supply line 125 to fall below reference voltage 120 while continuing to maintain the voltage of power supply line 135 approximately equal to reference voltage 295. In this case, transistor 930 operates with reduced current, thereby improving the ability of write data line 968 to overcome transistor 930 and pull down node 965 as previously described. By maintaining the voltage of power supply line 135 approximately equal to reference voltage 295 during this write operation, transistor 940 operates with sufficient current to pull down the voltage of node 965 as also previously described.

Other embodiments are also contemplated. For example, a split power switch in accordance with various embodiments described herein may be used with SRAM cells providing multiple bidirectional or unidirectional read or write ports. In addition, although a positive reference voltage 120 has been described herein, a negative reference voltage is also contemplated. Moreover, although the weakening of one side of an SRAM cell has been described in relation to permitting the voltage of one of power supply lines 125 or 135 to drop, split power switch 140 may alternatively be implemented to weaken one of power supply lines 125 or 135 by reducing current or floating one of power supply lines 125 or 135. Advantageously, various embodiments of split power switch 140 described herein can also continue to provide reliable voltage operation ranges for connected SRAM cells despite possible variations in individual circuit components.

As known by one of ordinary skill in the art, this invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, register transfer, and/or schematic capture levels. Examples of HDLs include, but are not limited to: GDS II and OASIS (layout level); various SPICE languages, and IBIS (circuit netlist level); Verilog and VHDL (register transfer level); and Virtuoso custom design language and Design Architecture-IC custom design language (schematic capture level). HDL descriptions may also be used for a variety of purposes, including but not limited to layout, behavior, logic and circuit design verification, modeling, and/or simulation The foregoing disclosure is not intended to limit the invention to the precise forms or particular fields of use disclosed. It is contemplated that various alternate embodiments and/or modifications to the invention, whether explicitly described or implied herein, are possible in light of the disclosure. For example, although various embodiments have been described using particular transistors to perform various switching operations, such transistors are non-limiting examples of various types of switches that may be used to perform such operations. Accordingly, other transistors and other types of switches may be used where appropriate.

Having thus described embodiments of the invention, persons of ordinary skill in the art will recognize that changes may be made in form and detail without departing from the scope of the invention. Thus the invention is limited only by the claims.

What is claimed is:

1. A memory device comprising:
    a first power supply line;
    a second power supply line;
    a first static random access memory (SRAM) cell comprising first and second cross-coupled logic gates, wherein the first power supply line is connected with the first cross-coupled logic gate, wherein the second power supply line is connected with the first cross-coupled logic gates; and
    a split power switch circuit configured to variably split a provided voltage into the first and second power supply lines, thereby, variably adjusting a first power level provided to the first power supply line to maintain a first logic state in the SRAM cell and a second power level provided to the first power supply line to write the first logic state in the SRAM cell.

2. The memory device of claim 1, wherein the second power supply line is connected with the second cross-coupled logic gate.

3. The memory device of claim 1, further comprising a second SRAM cell comprising third and fourth cross-coupled logic gates, wherein the first power supply line is connected with the third cross-coupled logic gate, wherein the second power supply line is connected with one of the third and fourth cross-coupled logic gates, wherein the first and second SRAM cells comprise a first column of SRAM cells.

4. The memory device of claim 3, further comprising:
    a third SRAM cell comprising fifth and sixth cross-coupled logic gates, wherein the first power supply line is connected with the fifth cross-coupled logic gate, wherein the second power supply line is connected with one of the fifth and sixth cross-coupled logic gates; and
    a fourth SRAM cell comprising seventh and eighth cross-coupled logic gates, wherein the first power supply line is connected with the seventh cross-coupled logic gate, wherein the second power supply line is connected with one of the seventh and eighth cross-coupled logic gates, wherein the third and fourth SRAM cells comprise a second column of SRAM cells.

5. The memory device of claim 1, wherein the split power switch circuit further comprises a second switch adapted to selectively provide a third power level to the second power supply line to maintain a second logic state in the SRAM cell and selectively provide a fourth power level to the second power supply line to write the second logic state in the SRAM cell.

6. The memory device of claim 5, the split power switch circuit further comprising:
   a third switch connected with the first power supply line, wherein the third switch is adapted to maintain the second power level at the first power supply line; and
   a fourth switch connected with the second power supply line, wherein the fourth switch is adapted to maintain the fourth power level at the second power supply line.

7. The memory device of claim 5, the split power switch circuit further comprising a third switch connected with the first and second power supply lines, wherein the third switch is adapted to provide a current path between the first and second power supply lines.

8. The memory device of claim 5, the split power switch circuit further comprising:
   a third switch connected with the first power supply line and a logic signal, wherein the third switch is adapted to selectively provide the first power level to the first power supply line in response to the logic signal following a time period; and
   a fourth switch connected with the second power supply line and the logic signal, wherein the fourth switch is adapted to selectively provide the first power level to the second power supply line in response to the logic signal following the time period.

9. The memory device of claim 5, the split power switch circuit further comprising a third switch connected with the first power supply line, the second power supply line, and a logic signal, wherein the third switch is adapted to selectively provide a current path between the first and second power supply lines in response to the logic signal.

10. A memory device comprising:
    a first power supply line;
    a second power supply line;
    a first static random access memory (SRAM) cell comprising first and second cross-coupled logic gates, wherein the first power supply line is connected with the first cross-coupled logic gate, wherein the second power supply line is connected with one of the first and second cross-coupled logic gates; and
    a split power switch circuit configured to variably split a provided voltage into the first and second power supply lines, thereby, variably adjusting a first power level provided to the first power supply line to maintain a first logic state in the SRAM cell and a second power level provided to the first power supply line to write the first logic state in the SRAM cell,
    wherein the split power switch circuit further comprises a second switch adapted to selectively provide a third power level to the second power supply line to maintain a second logic state in the SRAM cell and selectively provide a fourth power level to the second power supply line to write the second logic state in the SRAM cell, and
    wherein the split power switch circuit further comprises first and second logic circuits adapted to control the first and second switches, respectively, in response to at least one of a write enable signal and a write data signal.

11. A memory device comprising:
    a first power supply line;
    a second power supply line;
    a first static random access memory (SRAM) cell comprising first and second cross-coupled logic gates, wherein the first power supply line is connected with the first cross-coupled logic gate, wherein the second power supply line is connected with one of the first and second cross-coupled logic gates; and
    a split power switch circuit configured to variably split a provided voltage into the first and second power supply lines, thereby, variably adjusting a first power level provided to the first power supply line to maintain a first logic state in the SRAM cell and a second power level provided to the first power supply line to write the first logic state in the SRAM cell,
    wherein the split power switch circuit further comprises a second switch adapted to selectively provide a third power level to the second power supply line to maintain a second logic state in the SRAM cell and selectively provide a fourth power level to the second power supply line to write the second logic state in the SRAM cell, and
    wherein the split power switch circuit further comprises a third switch connected with the first and second power supply lines, wherein the third switch is adapted to maintain a voltage difference between the first and second power supply lines.

* * * * *